(12) United States Patent
Lu

(10) Patent No.: US 11,644,914 B2
(45) Date of Patent: May 9, 2023

(54) DISPLAY PANEL AND DISPLAY DEVICE

(71) Applicant: Xiamen Tianma Micro-Electronics Co., Ltd., Xiamen (CN)

(72) Inventor: Feng Lu, Shanghai (CN)

(73) Assignee: XIAMEN TIANMA MICRO-ELECTRONICS CO., LTD., Xiamen (CN)

( * ) Notice: Subject to any disclaimer, the term of this patent is extended or adjusted under 35 U.S.C. 154(b) by 0 days.

(21) Appl. No.: 17/303,709

(22) Filed: Jun. 4, 2021

(65) Prior Publication Data

US 2022/0165082 A1 May 26, 2022

(30) Foreign Application Priority Data

Nov. 30, 2020 (CN) .......................... 202011380917.0

(51) Int. Cl.
| | |
|---|---|
| G06F 3/041 | (2006.01) |
| G06V 40/13 | (2022.01) |
| H10K 59/38 | (2023.01) |
| H10K 59/40 | (2023.01) |
| G06V 10/14 | (2022.01) |
| H10K 59/65 | (2023.01) |
| H10K 59/60 | (2023.01) |
| H01L 27/32 | (2006.01) |

(52) U.S. Cl.
CPC ........ *G06F 3/0412* (2013.01); *G06V 40/1318* (2022.01); *H01L 27/322* (2013.01); *H01L 27/323* (2013.01); *G06F 2203/04112* (2013.01); *G06V 10/14* (2022.01); *H01L 27/3227* (2013.01); *H01L 27/3234* (2013.01)

(58) Field of Classification Search
CPC ......... G06F 3/0412; G06F 2203/04112; G06V 40/1318; G06V 10/14; H01L 27/322; H01L 27/323; H01L 27/3227; H01L 27/3234; H01L 51/5281; H01L 51/5284
See application file for complete search history.

(56) References Cited

U.S. PATENT DOCUMENTS

2017/0220844 A1\* 8/2017 Jones .................. A61B 5/0059
2021/0174049 A1\* 6/2021 Hai ..................... G06V 40/1318

\* cited by examiner

*Primary Examiner* — Abhishek Sarma
(74) *Attorney, Agent, or Firm* — Alston & Bird LLP

(57) ABSTRACT

A display panel includes a base substrate, an array layer located at one side of the base substrate, a display layer located at one side of the array layer away from the base substrate, a protective layer located at one side of the display layer away from the array layer, first and second light-shielding layers and a light-sensing sensor layer. The display layer includes multiple light-emitting elements. The first light-shielding layer includes multiple first imaging pin-holes. The second light-shielding layer includes multiple second imaging pin-holes corresponding to the first imaging pin-holes. The light-sensing sensor layer is located at one side of the display layer away from the protective layer, for detecting images generated via the first imaging pin-holes. The second light-shielding layer shields beams emitted from pin-hole imaging light sources and totally reflected through a touch surface of the protective layer.

8 Claims, 16 Drawing Sheets

DISPLAY PANEL AND DISPLAY DEVICE

CROSS-REFERENCE TO RELATED APPLICATION

This application claims priority to Chinese Patent Application No. 202011380917.0 filed Nov. 30, 2020, the disclosure of which is incorporated herein by reference in its entirety.

TECHNICAL FIELD

The present disclosure relates to display technologies and, in particular, to a display panel and a display device.

BACKGROUND

As science and technology develop, various display devices with fingerprint recognition functions, such as mobile phones, tablet computers and intelligent wearable devices, have appeared on the market. Functions such as unlocking the display device and payment can be achieved by performing recognition on users' fingerprints, thereby simplifying the rights verification process and improving the user experience.

Currently, a sensor for the fingerprint recognition of an Organic Light-Emitting Diode (OLED) display device is usually provided on one side facing away from a display surface of the OLED display device. The basic principle of the fingerprint recognition of the OLED display device is as follows: beams generated by an external fingerprint recognition light source or by reusing an organic light-emitting element of the OLED display device reach a finger and a contact surface of the OLED display device, so that the beams are reflected after entering ridges and valleys of the fingerprint of the finger, and the reflected beams are received by a fingerprint recognition element, where the fingerprint recognition element performs imaging according to a corresponding imaging principle to implement fingerprint recognition. In order to improve the accuracy of fingerprint imaging and detection, a light-shielding layer is provided in the OLED display device. The light-shielding layer is provided with imaging pin-holes, so that the beams reflected back from the finger and the contact surface of the OLED display device can pass through the imaging pin-holes of the light-shielding layer and be received by the fingerprint recognition element, where the fingerprint recognition element performs imaging according to the pin-hole imaging principle to implement fingerprint recognition.

In some OLED display devices, the fingerprint recognition element is fully attached onto a back side of the display device by using an optical adhesive. When the fingerprint recognition is performed, beams incident on the contact surface of the display device with an angle greater than the critical angle of total reflection will be directly reflected without carrying fingerprint information due to air gaps between the fingerprint valleys and the contact surface of the display device, where such beams will cause strong interference when striking onto the fingerprint recognition element and adversely affect the fingerprint recognition accuracy.

SUMMARY

A display panel and a display device are provided, in accordance with embodiments of the present disclosure, to improve the fingerprint recognition accuracy based on the pin-hole imaging principle.

In a first aspect, an embodiment of the present disclosure provides a display panel, including: a base substrate, an array layer located at one side of the base substrate, a display layer located at one side of the array layer facing away from the base substrate, a protective layer located at one side of the display layer facing away from the array layer, a first light-shielding layer, a second light-shielding layer and a light-sensing sensor layer. The display layer includes multiple light-emitting elements; the first light-shielding layer includes multiple first imaging pin-holes; the second light-shielding layer includes multiple second imaging pin-holes corresponding to the first imaging pin-holes. The light-sensing sensor layer is located at one side of the display layer facing away from the protective layer and used for detecting images generated via the first imaging pin-holes. The second light-shielding layer is used for shielding beams emitted from pin-hole imaging light sources and totally reflected through a touch surface of the protective layer.

In a second aspect, a display device is further provided in an embodiment of the present disclosure, which includes the display panel described above.

The display panel provided in the embodiments of the present disclosure includes a base substrate, an array layer located at one side of the base substrate, a display layer located at one side of the array layer facing away from the base substrate, a protective layer located at one side of the display layer facing away from the array layer, a first light-shielding layer, a second light-shielding layer and a light-sensing sensor layer. The display layer includes multiple light-emitting elements; the first light-shielding layer includes multiple first imaging pin-holes; the second light-shielding layer includes multiple second imaging pin-holes corresponding to the first imaging pin-holes; and the light-sensing sensor layer is located at one side of the display layer facing away from the protective layer, and used for detecting images generated via the first imaging pin-holes. The second light-shielding layer is used for shielding beams emitted from pin-hole imaging light sources and totally reflected through a touch surface of the protective layer. The first light-shielding layer is provided, the first light-shielding layer is provided with multiple first imaging pin-holes, and the first imaging pin-holes transmit fingerprint recognition beams to achieve the fingerprint recognition based on the pin-hole imaging principle. The second light-shielding layer is provided, the second light-shielding layer is provided with multiple second imaging pin-holes corresponding to the first imaging pin-holes. The second imaging pin-holes are used for transmitting fingerprint recognition beams, and the second light-shielding layer is used for shielding beams which are directly and totally reflected by the touch surface of the protective layer and do not carry any fingerprint information, so as to prevent these beams from being received by the light-sensing sensor layer, thus improving the fingerprint recognition accuracy based on the pin-hole imaging principle.

DETAILED DESCRIPTION

Figure 1:
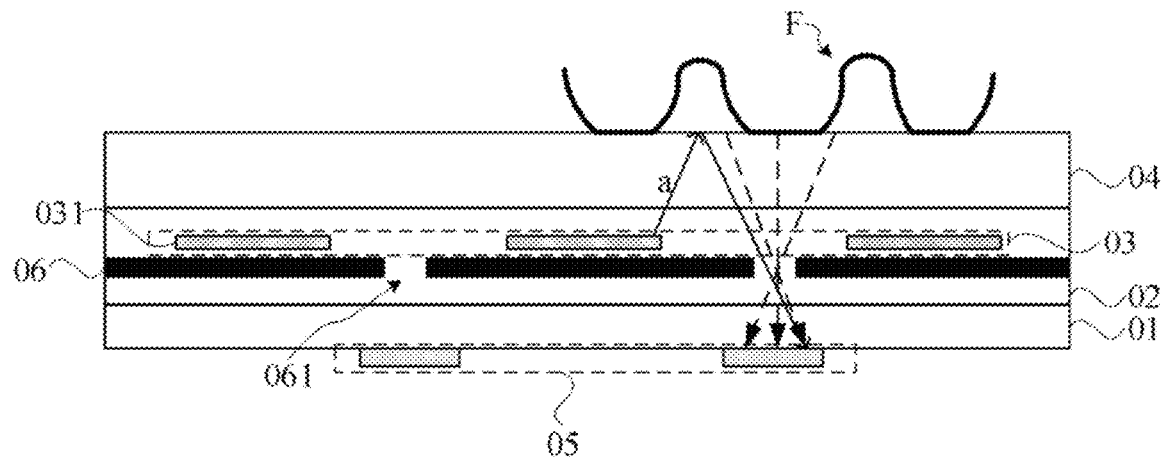
FIG. 1 is a structural diagram of a display panel in related technology.

Hereinafter the present disclosure will be further described in detail in conjunction with drawings and embodiments. It is to be understood that the embodiments set forth herein are intended to explain the present disclosure rather than to limit the present disclosure. Additionally, it is to be noted that for ease of description, merely part, not all, of the structures related to the present disclosure are illustrated in the drawings.

Terms used in the embodiments of the present disclosure are merely used to describe specific embodiments and not intended to limit the present disclosure. It is to be noted that nouns of locality, including "on", "under", "left" and "right", used in the embodiments of the present disclosure are described from perspective of the illustrated drawings and are not to be construed as limitations to the embodiments of the present disclosure. Additionally, in the context, it is to be understood that when an element is formed "on" or "under" another element, the element may be directly formed "on" or "under" another element, or may be indirectly formed "on" or "under" another element via an intermediate element. The terms "first", "second" and the like are merely used for description and used to distinguish between different components rather than indicate any order, quantity, or importance. For those of ordinary skill in the art, the above terms can be construed according to specific situations in the present disclosure.

FIG. 1 is a structural diagram of a display panel in a related technology. Referring to FIG. 1, the display panel includes a base substrate 01, an array layer 02 located at one side of the base substrate 01, a display layer 03 and a protective layer 04. The display layer 03 includes multiple light-emitting elements 031, and the array layer 02 may include multiple thin film transistors (TFTs) and pixel circuits composed of TFTs (which are not shown in FIG. 1), the pixel circuits are used for driving the multiple light-emitting elements 031 in the display layer 03. The display panel further includes a light-sensing sensor layer 05 and a light-shielding layer 06. The light-shielding layer 06 is provided with multiple imaging pin-holes 061. The multiple light-emitting elements 031 in the display layer 03 are reused as fingerprint recognition light sources. After beams generated by the light-emitting element 031 reach a fingerprint F and a contact surface of the protective layer 04, since fingerprint valleys and fingerprint ridges have different reflection degrees for the beams, the reflected beams are incident onto the light-sensing sensor layer 05 through the imaging pin-hole 061. In a case that a diameter of each imaging pin-hole is small enough, a fingerprint image can be imaged to the light-sensing sensor layer 05 according to the pin-hole imaging principle to implement fingerprint recognition.

Since the fingerprint includes the fingerprint valleys and the fingerprint ridges, when the finger is in contact with an operation surface of the protective layer 04, air gaps are generated between the fingerprint valleys and the protective layer 04; a beam a whose angle of incidence is greater than or equal to a critical angle of total reflection cannot be incident to the finger and is directly totally reflected on an upper surface of the protective layer 04; since such beam does not carry fingerprint information, such beam, once striking onto the light-sensing sensor layer 05 through the imaging pin-hole 061, may cause interference on a fingerprint recognition signal and adversely affect the fingerprint imaging accuracy.

In view of the above, a display panel is provided in an embodiment of the present disclosure. The display panel includes a base substrate, an array layer located at one side of the base substrate, a display layer located at one side of the array layer facing away from the base substrate, a protective layer located at one side of the display layer facing away from the array layer, a first light-shielding layer, a second light-shielding layer and a light-sensing sensor layer. The display layer includes multiple light-emitting elements. The first light-shielding layer includes multiple first imaging pin-holes. The second light-shielding layer includes multiple second imaging pin-holes which respectively correspond to the multiple first imaging pin-holes. The light-sensing sensor layer is located at one side of the display layer facing away from the protective layer and used for detecting images generated via the multiple first imaging pin-holes. The second light-shielding layer is used for shielding beams emitted from a pin-hole imaging light source and totally reflected through a touch surface of the protective layer.

Figure 2:
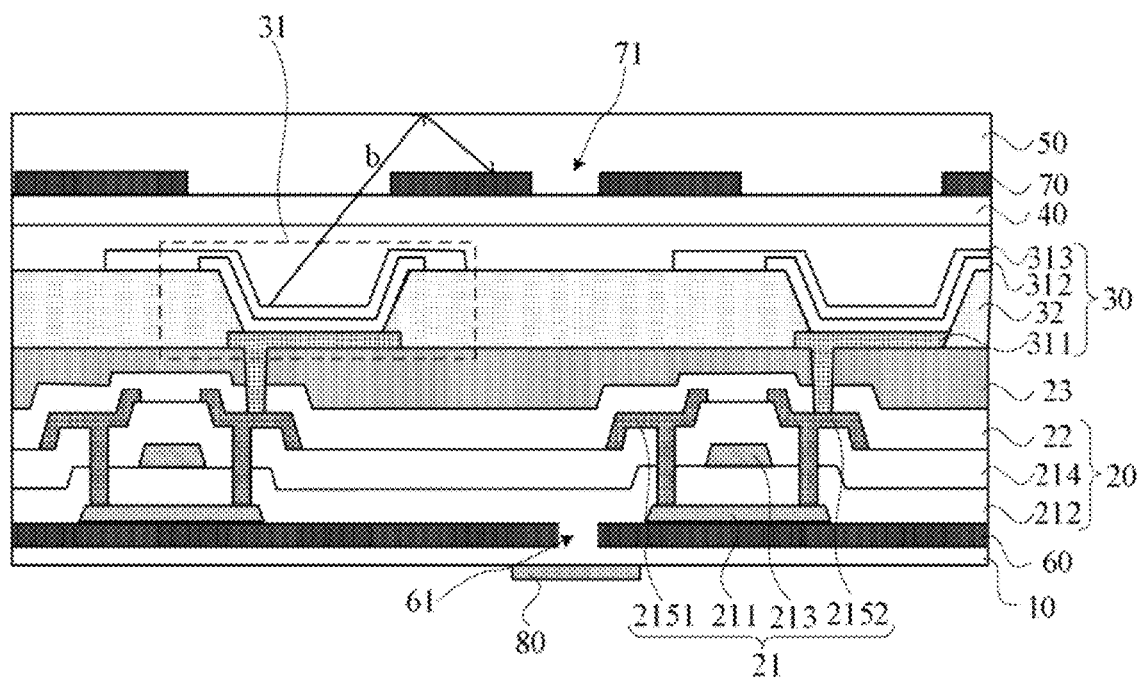
FIG. 2 is a structural diagram of a display panel according to an embodiment of the present disclosure.

FIG. 2 is a structural diagram of an exemplary display panel according to an embodiment of the present disclosure. Referring to FIG. 2, the display panel includes a base substrate 10, where the base substrate 10 may be flexible, i.e., the base substrate 10 may be extensible, foldable, bendable, or rollable, such that the display panel may be extensible, foldable, bendable, or rollable. The base substrate 10 may be made from any suitable insulating material having flexibility. The base substrate 10 is used for blocking oxygen and moisture, preventing moisture or impurities from diffusing through the base substrate 10. In addition, an upper surface of the base substrate 10 is formed as a flat surface. For example, the base substrate 10 may be formed of a polymer material such as polyimide (PI), polycarbonate (PC), polyether sulfone (PES), polyethylene terephthalate (PET), polyethylene naphthalate (PEN), polyarylate (PAR) or glass fiber reinforced plastic (FRP), and may be transparent, translucent or opaque. Optionally, the display panel may further include a buffer layer (not shown in FIG. 2) located on the base substrate 10, and the buffer layer may cover an entire upper surface of the base substrate 10. The base substrate 10 may alternatively be rigid, which may be, for example, a glass substrate, thereby forming a rigid display panel.

An array layer 20 is located at one side of the base substrate 10. Specifically, the array layer 20 is located at one side of the base substrate 10 facing towards a display surface or a touch surface of the display panel 10. The array layer 20 may include multiple thin film transistors 21 (TFTs) and pixel circuits composed of TFTs, where the pixel circuits are used for driving light-emitting elements in a display layer. In the exemplary embodiment of the present disclosure, the structure description will be made in the case of top-gate type TFT. The TFT 21 includes an active layer 211 located on the base substrate 10, where the active layer 211 may be an amorphous silicon material, a polysilicon material, a metal oxide material or the like. The active layer 211, if made from the polysilicon material, may be formed using a low-temperature amorphous silicon technique, that is, the amorphous silicon material is formed into the polysilicon material by laser melting. In addition, various methods such as a rapid thermal annealing (RTA) method, a solid phase crystallization (SPC) method, an excimer laser annealing (ELA) method, a metal induced crystallization (MIC) method, a metal induced lateral crystallization (MILC) method, or a succession lateral solidification (SLS) may further be used for forming the active layer 211. The active layer 211 further includes a source region and a drain region formed by doping N-type impurity ions or P-type impurity ions, and a channel region is formed between the source region and the drain region. The array layer 20 further includes a gate insulating layer 212 located on the active layer 211, where the gate insulating layer 212 includes an inorganic layer such as silicon oxide, silicon nitride, and may include a single layer or multiple layers. The TFT 21 further includes a gate 213 located on the gate insulating layer 212, where the gate 213 may include a single layer or multiple layers of gold (Au), silver (Ag), cuprum (Cu), nickel (Ni), platinum (Pt), palladium (Pd), aluminum (Al), molybdenum (MO) or chromium (Cr), or an alloy such as aluminum (Al): neodymium (Nd) or molybdenum (MO): wolfram (W). Selection may be made according to actual situations in the practical implementation. The array layer 20 further includes an interlayer insulating layer 214 located on the gate 213, where the interlayer insulating layer 214 may be formed by an inorganic insulating material such as silicon oxide or silicon nitride. Certainly, in other optional embodiments of the present disclosure, the interlayer insulating layer may be formed of an organic insulating material. The TFT 21 further includes a source electrode 2151 located on the interlayer insulating layer 214 and a drain electrode 2152 located on the interlayer insulating layer 214. The source electrode 2151 and the drain electrode 2152 are electrically connected (or bonded) to the source region and the drain region, respectively, through contact holes, where the contact holes are formed by selectively removing the gate insulating layer 212 and the interlayer insulating layer 214.

The array layer 20 may further include a passivation layer 22. Optionally, the passivation layer 22 is located on the source electrode 2151 of the thin film transistor 21 and the drain electrode 2152 of the thin film transistor 21. The passivation layer 22 may be formed of an inorganic material such as silicon oxide or silicon nitride, or may be formed of an organic material. The display panel may further include a planarization layer 23. Optionally, the planarization layer 23 is located on the passivation layer 22. The planarization layer 23 includes an organic material such as acryl, polyimide (PI) or benzocyclobutene (BCB); and the planarization layer 23 has a planarization function.

The display layer 30 is located at one side of the array layer 20 facing away from the base substrate 10, and includes multiple light-emitting elements 31. Optionally, the display layer 30 is located on the planarization layer 23. The display layer 30 includes an anode layer 311, an organic light-emitting material 312 and a cathode layer 313, which are sequentially disposed in a direction away from the base substrate 10. The display panel 30 further includes a pixel defining layer 32 located at one side the anode layer 311 away from the array layer 20. The pixel defining layer 32 may be made from an organic material such as polyimide (PI), polyamide, benzocyclobutene (BCB), acrylic resin or phenolic resin, or may be made from an inorganic material such as silicon nitride (SiNx).

Optionally, the anode layer 311 includes multiple anode patterns which have a one-to-one correspondence with pixels. The anode patterns in the anode layer 311 are connected to the source electrodes 2151 or the drain electrodes 2152 of the thin film transistors 21 through via-holes in the planarization layer 23 and the passivation layer 22. The pixel defining layer 32 is provided with multiple openings through which the anode layer 311 is exposed, and covers edges of patterns of the anode layer 311. At least a part of the organic light-emitting material 312 is filled in the openings of the pixel defining layer 32 and is in contact with the anode layer 311.

Optionally, the anode layer 311, the organic light-emitting material 312, and the cathode layer 313 defined by each opening of the pixel defining layer 32 constitute one light-emitting element 31 (which is as shown in a dashed box in FIG. 2). Each light-emitting element 31 may emit light with different colors according to different organic light-emitting materials 312. Each light-emitting element 31 constitutes one sub-pixel, and multiple sub-pixels jointly perform display of a picture.

Optionally, the display panel further includes an encapsulation layer 40 located on the display layer 30, and the encapsulation layer 40 completely covers the display layer 30 to seal the display layer 30. Optionally, the encapsulation layer 40 may be a thin film encapsulation layer, where the thin film encapsulation layer is located on the cathode layer 313 and includes an inorganic encapsulation layer, an organic encapsulation layer and an inorganic encapsulation layer sequentially disposed along the direction away from the base substrate 10 for preventing moisture and oxygen from corroding the light-emitting elements 31. In other embodiments of the present disclosure, the encapsulation layer 40 may include stacked organic and inorganic material layers in any number as desired, but at least one organic material layer and at least one inorganic material layer are alternately deposited, and the lowermost layer and the uppermost layer are inorganic material layers.

The display panel further includes a protective layer 50 located on the display layer 30. Optionally, the protective layer 50 is the outermost film layer of the display panel and may be a protective cover plate or a coverfilm. The protective layer 50 may be bonded to a film layer inside the display panel adjacent to the protective layer by means of an optically clear adhesive (OCA), and a surface of the protective layer 50 is an operation surface for touch control or fingerprint recognition of the display panel.

The display panel further includes a first light-shielding layer 60, a second light-shielding layer 70 and a light-sensing sensor layer 80. The first light-shielding layer 60 includes a first imaging pin-hole 61. The second light-shielding layer 70 includes a second imaging pin-hole 71 corresponding to the first imaging pin-hole 61. It is understood that the correspondence herein refers that the first imaging pin-hole 61 and the second imaging pin-hole 71 at least partially overlap in a direction perpendicular to the base substrate. The light-sensing sensor layer 80 is located at one side of the display layer 30 facing away from the protective layer 50 and is used for detecting an image generated via the first imaging pin-hole 61. FIG. 2 further shows a beam b which is incident onto a touch surface of the protective layer 50 and has an angle of incidence greater than or equal to the critical angle. The beam b is totally reflected on the touch surface of the protective layer 50. Since the second light-shielding layer 70 is provided, the beam b and beams having larger angles of incidence are all shielded by the second light-shielding layer 70 after being totally reflected, so that interference light is prevented from being transmitted to the light-sensing sensor layer 80 through the first imaging pin-hole 61, and the fingerprint recognition accuracy is improved. It is to be noted that the example of FIG. 2 only shows a case where the first light-shielding layer 60 is located under the second light-shielding layer 70, but this is not a limit to embodiments of the present disclosure.

Optionally, a diameter of the first imaging pin-hole 61 ranges from 5 microns to 20 microns. On the one hand, the diameter of the first imaging pin-hole 61 is less than 20 microns to ensure that the pin-hole for transmitting beams is small enough to achieve pin-hole imaging. On the other hand, the diameter of the first imaging pin-hole 61 is larger than 5 microns to satisfy the process accuracy requirements for forming the imaging pin-hole and reduce the process difficulty.

In technical solution of the embodiment of the present disclosure, the first light-shielding layer is provided with multiple first imaging pin-holes, and the first imaging pin-holes can transmit fingerprint recognition beams to achieve the fingerprint recognition based on the pin-hole imaging principle. The second light-shielding layer is provided with multiple second imaging pin-holes which correspond to the multiple first imaging pin-holes. The second imaging pin-holes are used for transmitting the fingerprint recognition beams. The second light-shielding layer is used for shielding beams directly and totally reflected by the touch surface of the protective layer without carrying fingerprint information, so as to prevent such beams from being received by the light-sensing sensor layer, thus improving the fingerprint recognition accuracy based on the pin-hole imaging principle.

On the basis of the above embodiment, optionally, the first light-shielding layer 60 is located between the second light-shielding layer 70 and the light-sensing sensor layer 80, and the second imaging pin-hole 71 is larger than the first imaging pin-hole 61. A distance x1 between a projection of an edge of the first imaging pin-hole 61 onto a plane where the second imaging pin-hole 71 is located and an edge of the second imaging pin-hole 71 satisfies the following formula:

$$x_1 \leq h \cdot \tan \theta - D \tag{1}$$

where h denotes a distance between the first light-shielding layer 60 and the second light-shielding layer 70 in the direction perpendicular to the base substrate, θ denotes a critical angle at which a beam is totally reflected on the touch surface of the protective layer, and D denotes a width of the first imaging pin-hole 61.

Figure 3:
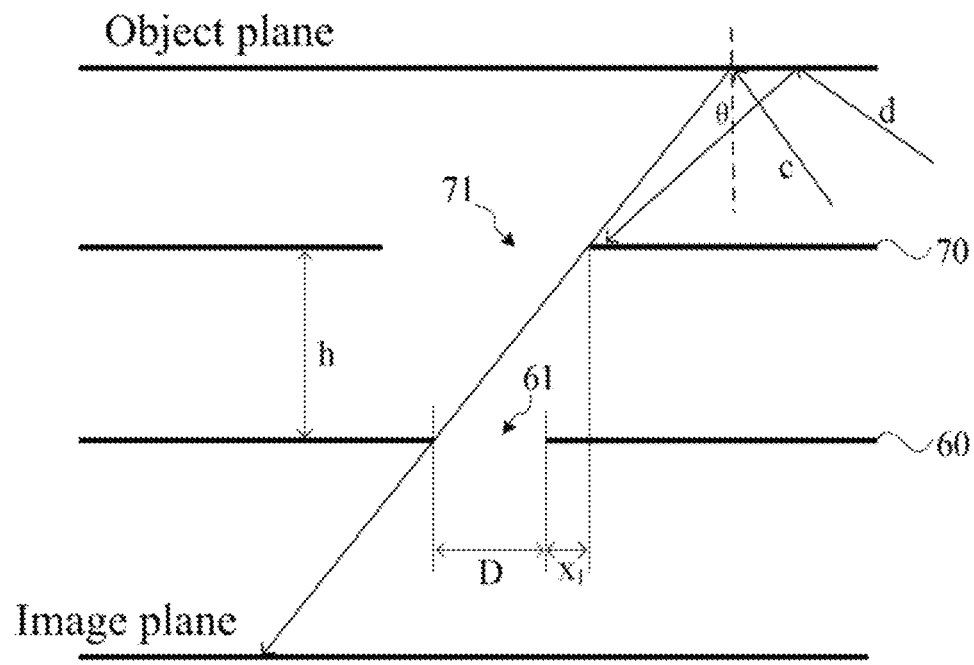
FIG. 3 is a partial cross-sectional view of a display panel taken along a direction perpendicular to a base substrate according to an embodiment of the present disclosure.

FIG. 3 is a partial cross-sectional view of an exemplary display panel taken along a direction perpendicular to a base substrate according to an embodiment of the present disclosure, and FIG. 3 only shows structures of the first light-shielding layer 60 and the second light-shielding layer 70. An angle of incidence at which a beam c is incident onto an object plane (the touch surface of the protective layer) is $$\theta = \arcsin\left(\frac{1}{n_1}\right),$$

where $n_1$ denotes the refractive index of the protective layer, and the refractive index of air is 1. In FIG. 3, a critical case is shown in which the beam c, after being totally reflected by the object plane, passes exactly through a right edge of the second imaging pin-hole 71 and a left edge of the first imaging pin-hole 61, at this time, $x_0 = h \cdot \tan \theta - D$, where h denotes the distance between the first light-shielding layer 60 and the second light-shielding layer 70 in the direction perpendicular to the base substrate, and D denotes the width of the first imaging pin-hole 61. For a beam with an angle of incidence greater than θ, such as a beam d in FIG. 3, the beam d, after being totally reflected by the object plane, is shielded by the second light-shielding layer 70. The distance between the projection of the edge of the first imaging pin-hole onto the plane where the second imaging pin-hole is located and the edge of the second imaging pin-hole is less than or equal to $x_0$, so that the second light-shielding layer 70 shields beams which are directly and totally reflected by the protective layer and do not carry any fingerprint information, thus reducing the intensity of the interference light, and improving the fingerprint recognition accuracy.

Optionally, the display panel further includes a color filter layer 90 located at one side of the display layer 30 facing away from the array layer 20. The color filter layer 90 includes a black matrix layer 91 and color resists 92, where the color resists 92 are disposed at least corresponding to the light-emitting elements 31, and the black matrix layer 91 is reused as the second light-shielding layer 70.

Figure 4:
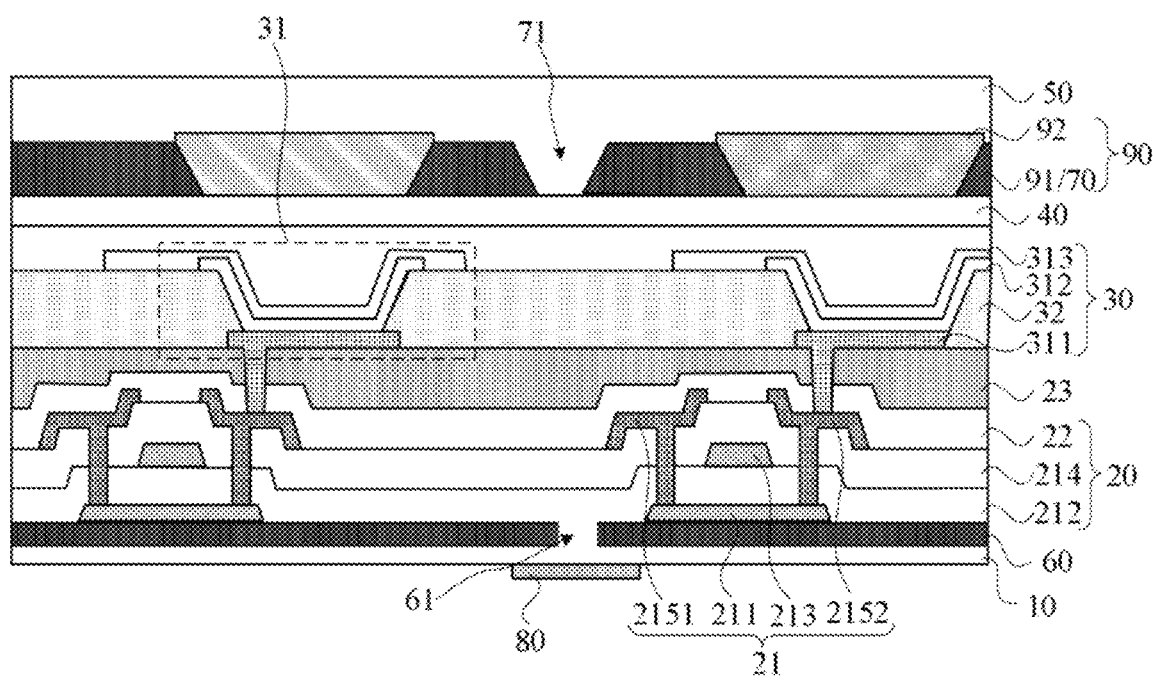
FIG. 4 is a structural diagram of another display panel according to an embodiment of the present disclosure.
Figure 5:
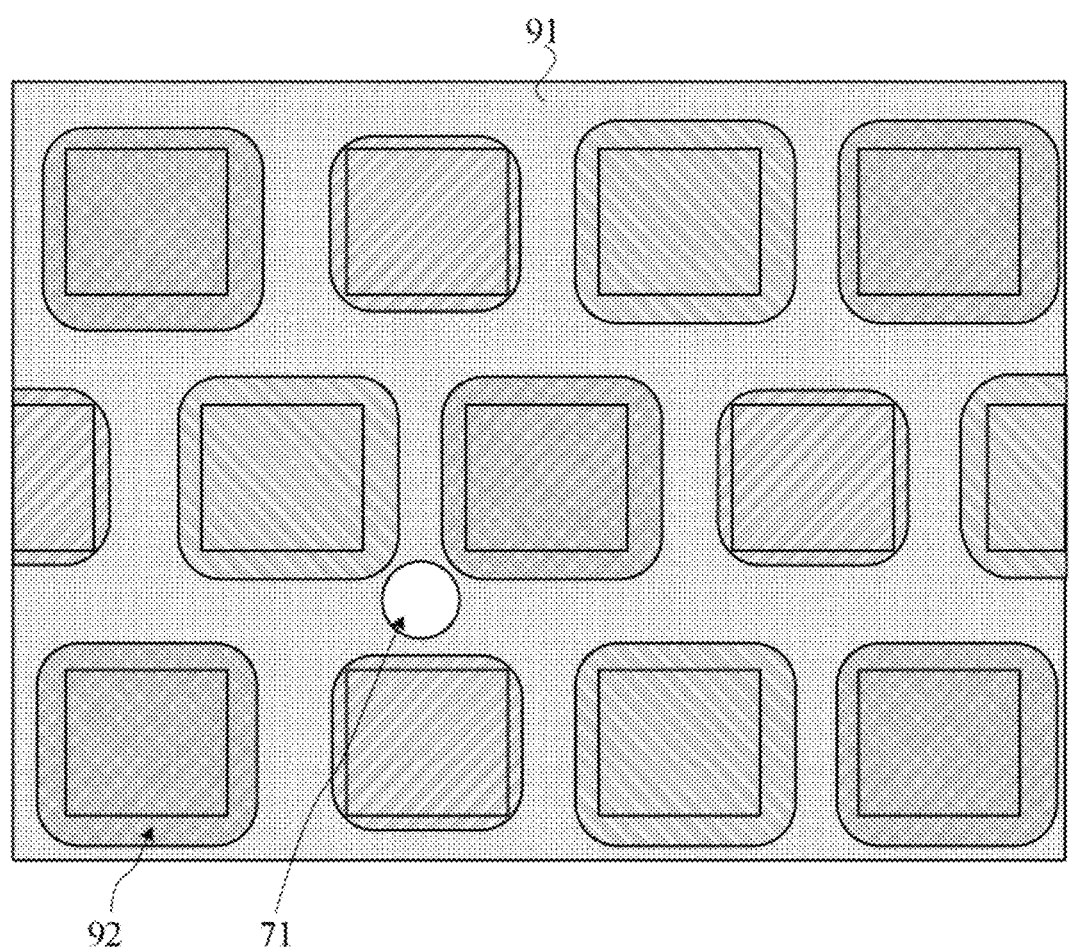
FIG. 5 is a top view of a color filter layer according to an embodiment of the present disclosure.

FIG. 4 is a structural diagram of a display panel according to another exemplary embodiment of the present disclosure. Referring to FIG. 4, the display panel further includes a color filter layer 90 located at one side of the display layer 30 facing away from the array layer 20. The color filter layer 90 includes a black matrix layer 91 and color resists 92, where the color resists 92 are disposed corresponding to the light-emitting elements 31, and the black matrix layer 91 is reused as the second light-shielding layer 70. FIG. 5 is an exemplary top view of a color filter layer according to an embodiment of the present disclosure. A region filled by dots is a region covered by the black matrix layer 91, regions surrounded by rounded rectangles are regions covered by the color resists 92, and rectangles denote regions corresponding to the light-emitting elements. The black matrix layer 91 may be a mesh structure, openings of the mesh structure correspond to the light-emitting elements. One opening defines one color resist 92, where regions between the rounded rectangles and the rectangles are regions in which the color resists 92 overlap the second light-shielding layer 70. The color resists 92 having different colors are spaced by the black matrix layer 91. The color resists 92 are disposed in a one-to-one correspondence with the light-emitting elements. The color resists 92 include color resist materials having different colors, and the color resist materials are of the same colors as the light emitting elements. It is to be noted that the correspondence of two components herein may be understood that orthographic projections of the two components onto the base substrate at least partially overlap. The color resists 92 may be arranged instead of providing a circular polarizer on the display layer 30.

Figure 6:
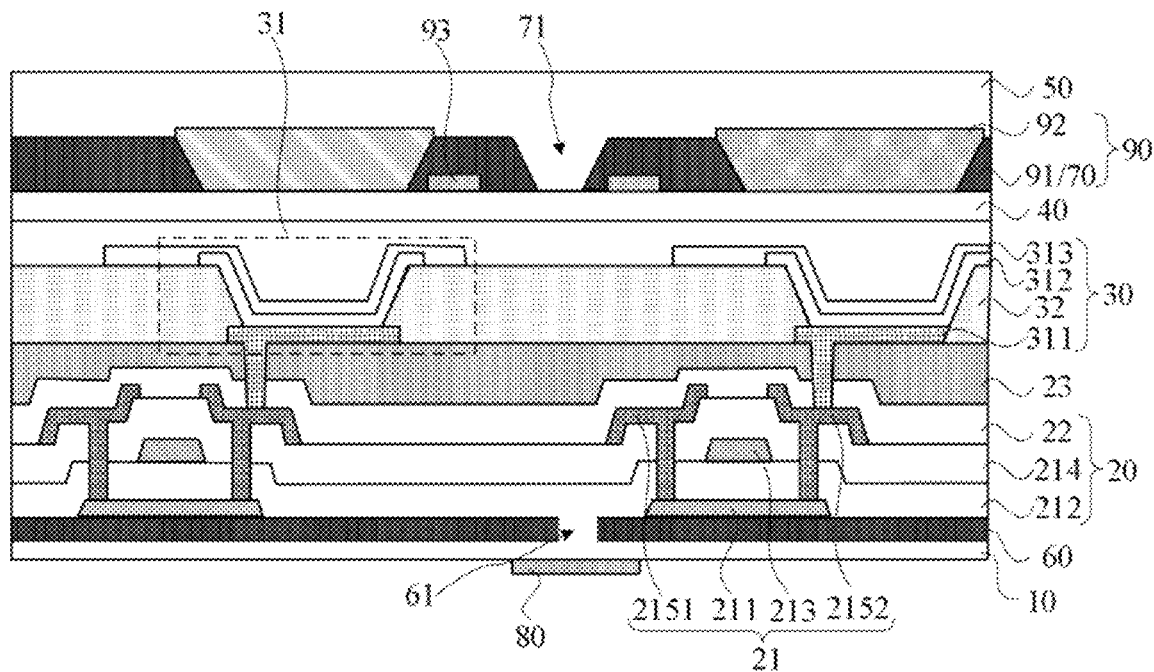
FIG. 6 is a structural diagram of another display panel according to an embodiment of the present disclosure.

In the application of display panel, a touch function is also an essential function, and with the development trends of integration of the display panel and making the display panel thinner and lighter, integrating a touch structure into the display panel is conducive to improving integration level. FIG. 6 is a structural diagram of another display panel according to an embodiment of the present disclosure. Referring to FIG. 6, optionally, the display panel further includes a touch layer 93 located between the black matrix layer 91 and the display layer 30, and the second light-shielding layer 70 shields the touch layer 93 in a direction perpendicular to a plane where the base substrate 10 is located. The touch layer 93 includes touch patterns for achieving the touch function of the display panel. In specific implementation, a self-capacitance manner or a mutual-capacitance manner may be used. The second light-shielding layer 70 (i.e., the black matrix layer 91) covers the touch layer 93 to prevent the touch patterns from being visible in a non-display state. A part of beams emitted by the light-emitting element, serving as a pin-hole imaging light source, are reflected by the touch layer adjacent to the second imaging pin-hole and then incident to a region of the first light-shielding layer outside the first imaging pin-hole. FIG. 6 shows a cross-sectional view of a display panel. The touch layer 93 includes a touch electrode. Specifically, a structure of the touch electrode may be a metal mesh, the touch electrode includes multiple metal wires extending in a first direction and multiple metal wires extending in a second direction, and the metal wires extending in different directions cross to form a mesh. The metal wires are located within a shielding range of the first light-shielding layer 91, i.e., the metal wires form mesh lines of the mesh structure corresponding to the first light-shielding layer 91.

It is understood that since the touch structure generally includes a metal layer or a metal oxide layer, a part of imaging beams may be reflected by the metal layer or the metal oxide layer directly to a light-sensing sensor, this part of the beams does not include the fingerprint information, and the imaging effect and the fingerprint recognition accuracy may be adversely affected. So that part of the beams reflected directly on the touch layer without being emitted to the touch surface can be blocked by the first light-shielding layer through setting a positional relationship between the light-emitting elements and the first imaging pin-holes, thus further improving the fingerprint recognition accuracy based on the pin-hole imaging principle.

Figure 7:
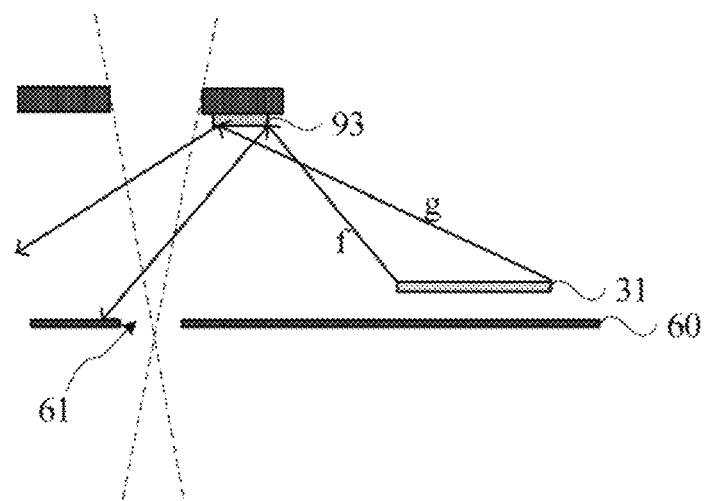
FIG. 7 is a partial cross-sectional view of another display panel taken along a direction perpendicular to a base substrate according to an embodiment of the present disclosure.

FIG. 7 is a partial cross-sectional view of the a display panel taken along a direction perpendicular to a base substrate according to another exemplary embodiment of the present disclosure, and FIG. 7 schematically illustrates optical paths in which beams emitted by the light-emitting element 31, serving as the pin-hole imaging light source, are incident onto the touch layer 93. The beam f emitted from the left end of the light-emitting element 31 and the beam g emitted from the right end of the light emitting element 31 are both shielded by the first light-shielding layer 60 after being reflected by the touch layer 93, and cannot be transmitted through the first imaging pin-hole 61, thereby avoiding being received by the light-sensing sensor (not shown in FIG. 7) and improving the fingerprint recognition accuracy.

Optionally, the display layer includes light-emitting elements having at least three light-emitting colors, where light-emitting elements of one color serve as pin-hole imaging light sources, and the second imaging pin-holes and the first imaging pin-holes are located between light-emitting elements having different colors from the light-emitting elements serving as the pin-hole imaging light sources. Optionally, the light-emitting elements include red light-emitting elements, green light-emitting elements and blue light-emitting elements, and the green light-emitting elements serve as the pin-hole imaging light sources.

Figure 8:
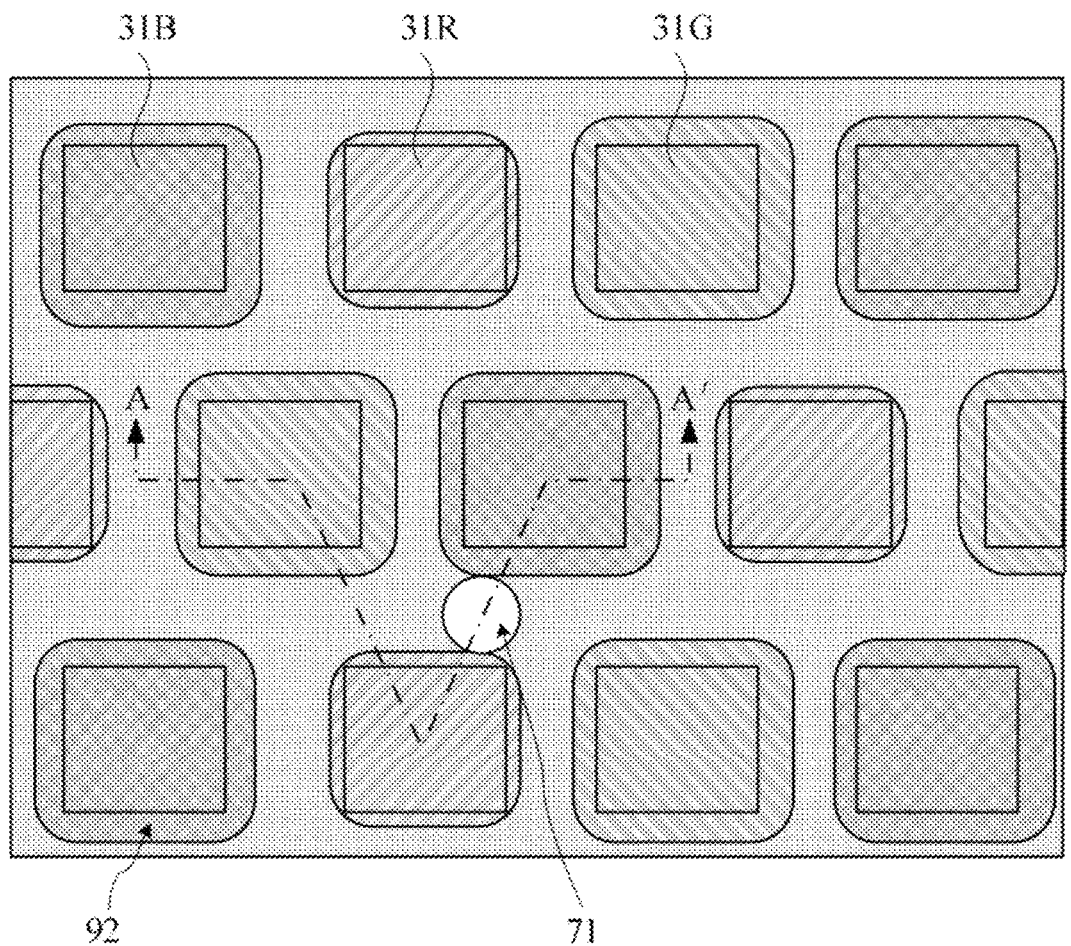
FIG. 8 is a partial top view of a display panel according to an embodiment of the present disclosure.
Figure 9:
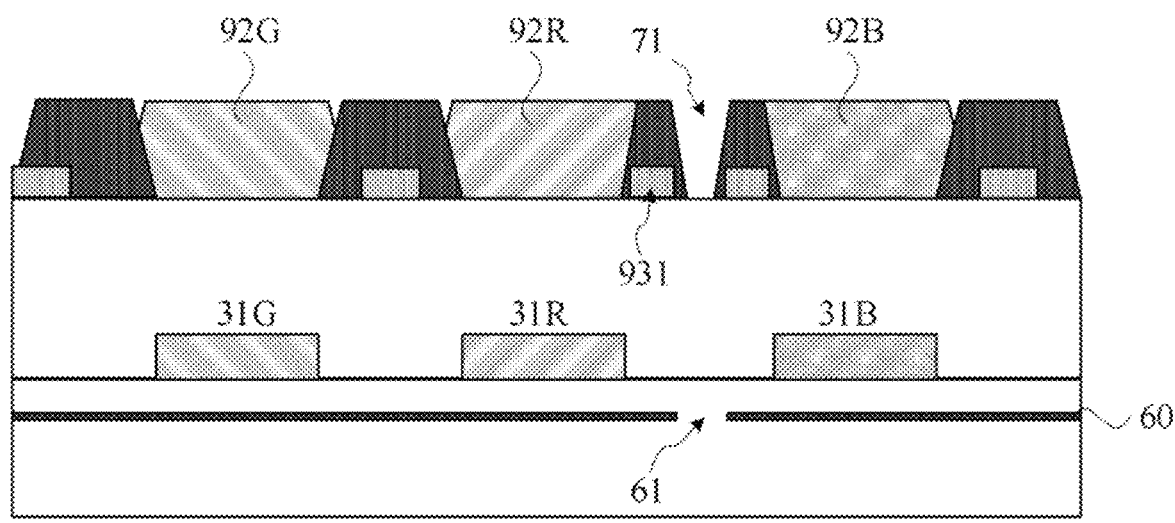
FIG. 9 is a cross-sectional view taken along line AA' of FIG. 8.

FIG. 8 is a partial top view of a display panel according to another exemplary embodiment of the present disclosure, and FIG. 9 is a cross-sectional view taken along line AA' of FIG. 8. For simplification, a part of the structure of the display panel is simplified in FIG. 9, and the following embodiment is the same. Referring to FIGS. 8 and 9 concurrently, the display layer includes the light-emitting elements having three light-emitting colors, the light-emitting elements are respectively the red light-emitting elements 31R, the green light-emitting elements 31G and the blue light-emitting elements 31B, and the three kinds of light-emitting elements are arranged in a delta shape. The green light-emitting elements 31G are used as the pin-hole imaging light sources. The first imaging pin-hole 61 and the second imaging pin-hole 71 are located between the red light-emitting element 31R and the blue light-emitting element 31B.

This arrangement facilitates increasing an angle of incidence at which a beam emitted by the pin-hole imaging light source is incident onto a touch pattern 931 adjacent to the second imaging pin-hole 71, so as to prevent a reflected beam from entering the first imaging pin-hole 61.

In other embodiments, in order to reduce the reflection at the touch layer, color resists may be formed under the touch layer. Optionally, at least part of at least one color resist extends between the touch layer and the display layer, the color of a color resist material between at least part of the touch layer and the display layer is different from the light-emitting color of the light-emitting elements serving as the pin-hole imaging light sources. Specifically, the at least part of at least one color resist extending between the touch layer and the display layer includes: the at least one color resist extending from a region corresponding to the light-emitting element to a location under the touch layer.

Figure 10:
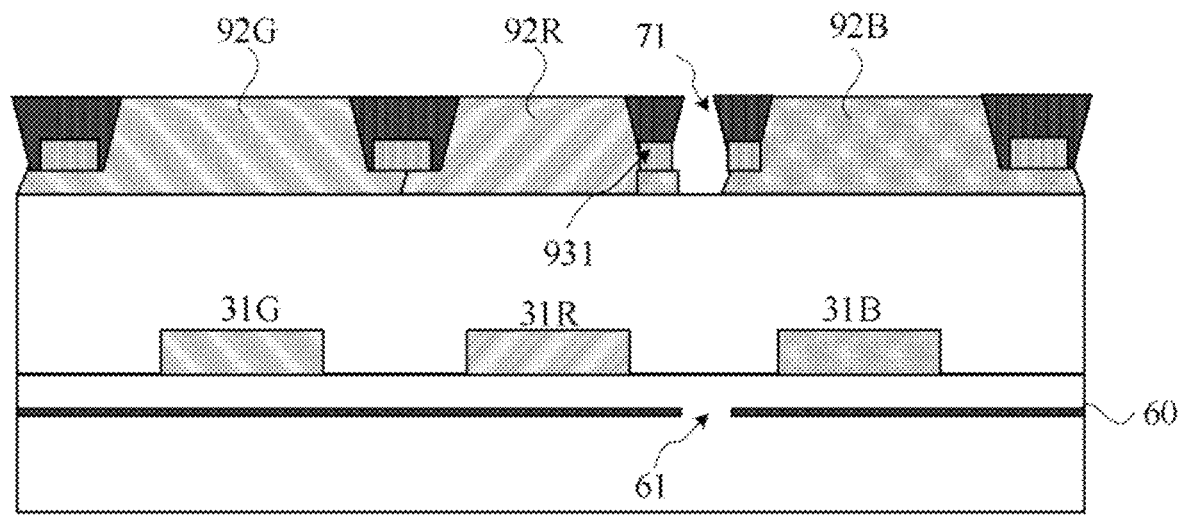
FIG. 10 is another cross-sectional view taken along line AA' of FIG. 8.

FIG. 10 is another cross-sectional view taken along line AA' of FIG. 8. Referring to FIG. 10, a blue color resist 92B extend under the touch patterns 931, thereby absorbing part of beams from the light-emitting elements 31G as the pin-hole imaging light sources, further reducing the probability that the touch patterns 931 reflect the beams to the first imaging pin-hole 61 and improving the fingerprint recognition effect.

In other embodiments, the red color resist 92R may extend under the touch patterns 931, or the blue color resist 92B and the red color resist 92R may both extend under the touch patterns 931. Optionally, two color resists are stacked between the touch layer adjacent to one first imaging pin-hole and the display layer in the direction perpendicular to the plane where the base substrate is located, and the colors of the two color resists are different from the light-emitting color of the light-emitting elements serving as the pin-hole imaging light sources.

Figure 11:
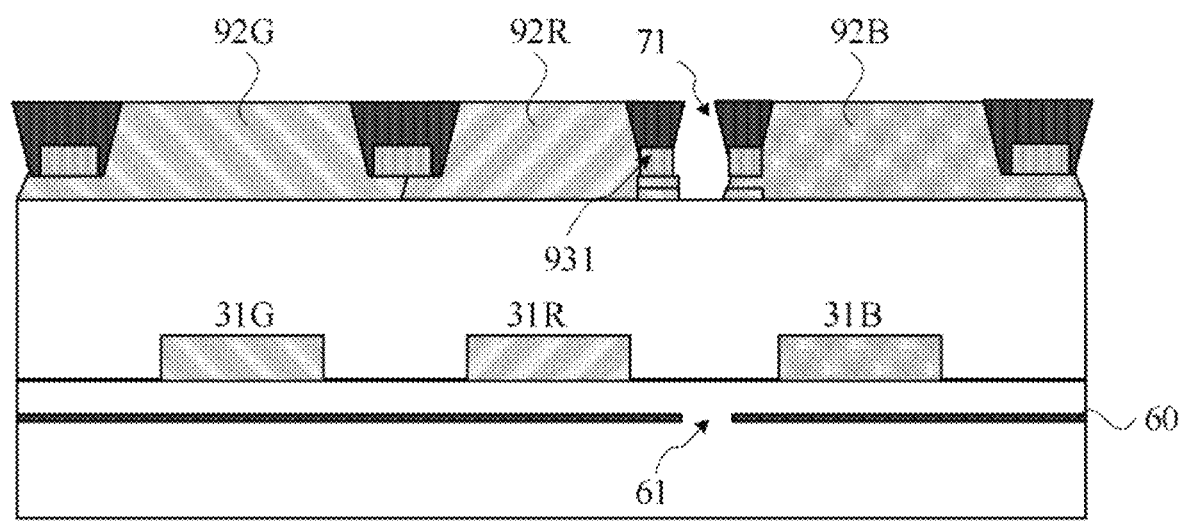
FIG. 11 is another cross-sectional view taken along line AA' of FIG. 8.

FIG. 11 is another cross-sectional view taken along line AA' of FIG. 8. Referring to FIG. 11, the red color resist 92R and the blue color resist 92B both extend under the touch patterns 931 and are stacked under the touch patterns 931, thereby absorbing part of beams from the light-emitting elements 31G as the pin-hole imaging light sources, further reducing the probability that the touch layer reflects the beams to the first imaging pin-hole 61 and improving the fingerprint recognition effect.

In addition, when the color resists of two colors are stacked under the touch patterns 931, the color resists under the touch layer may absorb light of two colors. For example, blue color resists 92B and red color resists 92R may be provided under a part of touch patterns 931, and green light-emitting elements 31G are used as pin-hole imaging light sources. Red color resists 92R and green color resists 92G are provided under another part of the touch patterns 931, and blue light emitting-elements 31B are used as pin-hole imaging light sources, so that the two-color light sources are used as the fingerprint recognition light sources for performing twice fingerprint recognitions in a time-division manner, so as to improve the fingerprint recognition accuracy.

Optionally, at least partial touch layer is covered by the color resist, and the color resist covers at least a part of a sidewall of the second imaging pin-hole 71.

Figure 12:
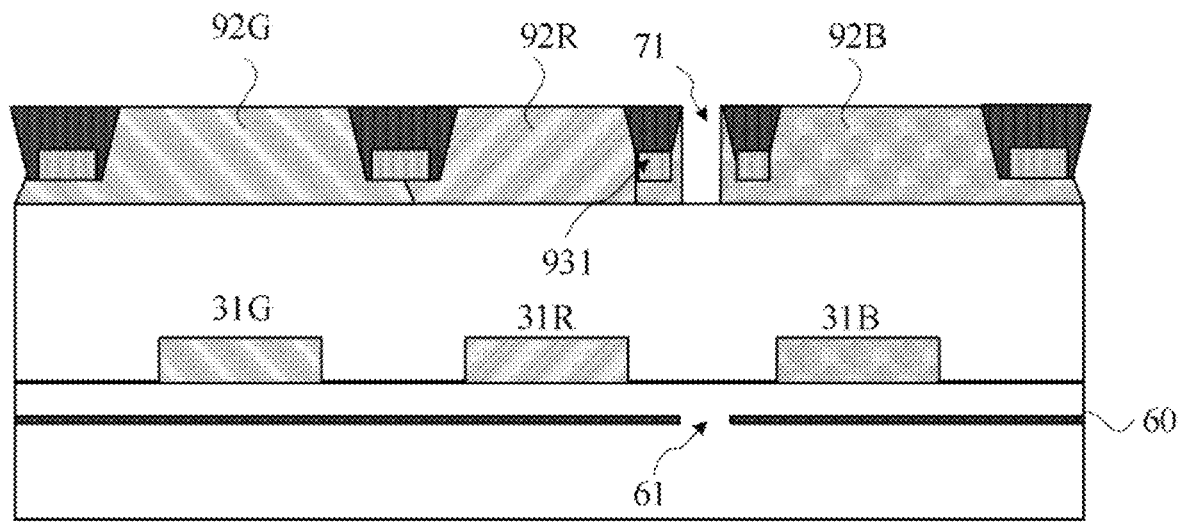
FIG. 12 is another cross-sectional view taken along line AA' of FIG. 8.

FIG. 12 is another cross-sectional view taken along line AA' of FIG. 8. Referring to FIG. 12, a part of blue color resist 92B extends under the touch patterns 931 and covers the sidewall of the second imaging pin-hole 71, thereby preventing sidewalls of the touch patterns 931 or the sidewall of the second imaging pin-hole 71 from reflecting light.

Optionally, the color resist at least partially covers the touch layer along a direction from the base substrate to the display layer.

Figure 13:
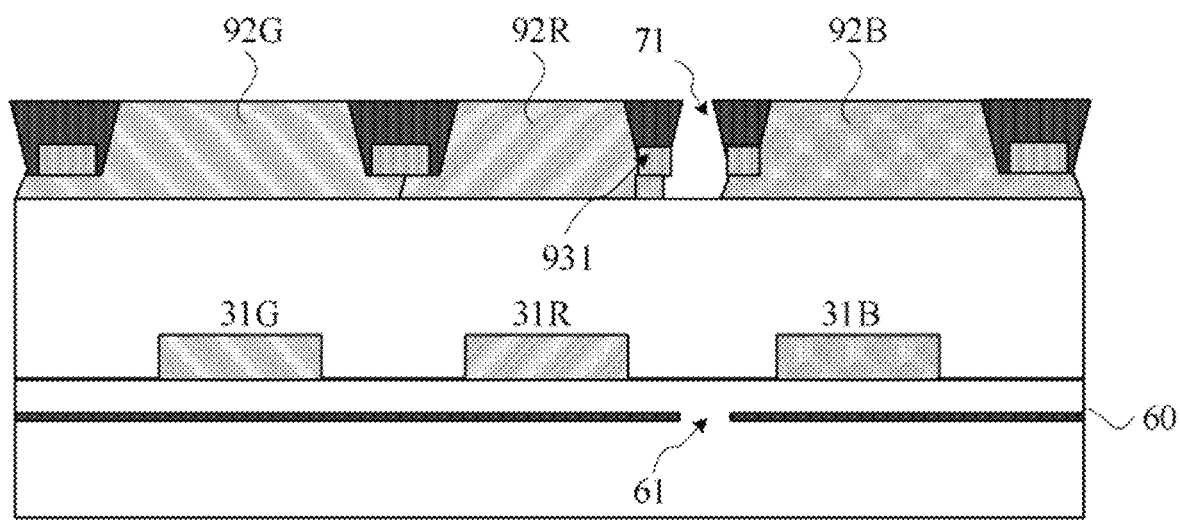
FIG. 13 is another cross-sectional view taken along line AA' of FIG. 8.

It is understood that the blue color resist 92B shown in FIG. 12 completely covers the touch patterns 931 adjacent to the second imaging pin-hole 71, which is only schematic. In specific implementation, the width of the color resist may be smaller than the width of the touch pattern due to process reasons. Optionally, the width of touch patterns 931 adjacent to the second imaging pin-hole 71 is smaller than the width of the color resists between the touch patterns 931 and the display layer. FIG. 13 is another cross-sectional view taken along line AA' of FIG. 8.

Referring to FIG. 13, a part of blue color resist 92B extends under the touch patterns 931, and the width of the touch pattern 931 on the left of the second imaging pin-hole 71 is larger than the width of the blue color resist 92B under such touch pattern 931.

In the above embodiment, the second light-shielding layer is located above the first light-shielding layer. In other embodiments, the second light-shielding layer may be provided under the first light-shielding layer. Optionally, the second light-shielding layer is located between the first light-shielding layer and the light-sensing sensor layer. A distance x2 between a projection of an edge of the first imaging pin-hole onto a plane where the second imaging pin-hole is located and an edge of the second imaging pin-hole satisfies the following formula:

$$x_2 \begin{cases} \geq D - h \cdot \tan \theta, \, h \cdot \tan \theta < D \\ \leq h \cdot \tan \theta - D, \, h \cdot \tan \theta > D \end{cases} \quad (2)$$

where h denotes the distance between the first light-shielding layer and the second light-shielding layer in the direction perpendicular to the base substrate, θ denotes the critical angle at which a beam is totally reflected on the touch surface of the protective layer, and D denotes the width of the first imaging pin-hole.

Figure 14:
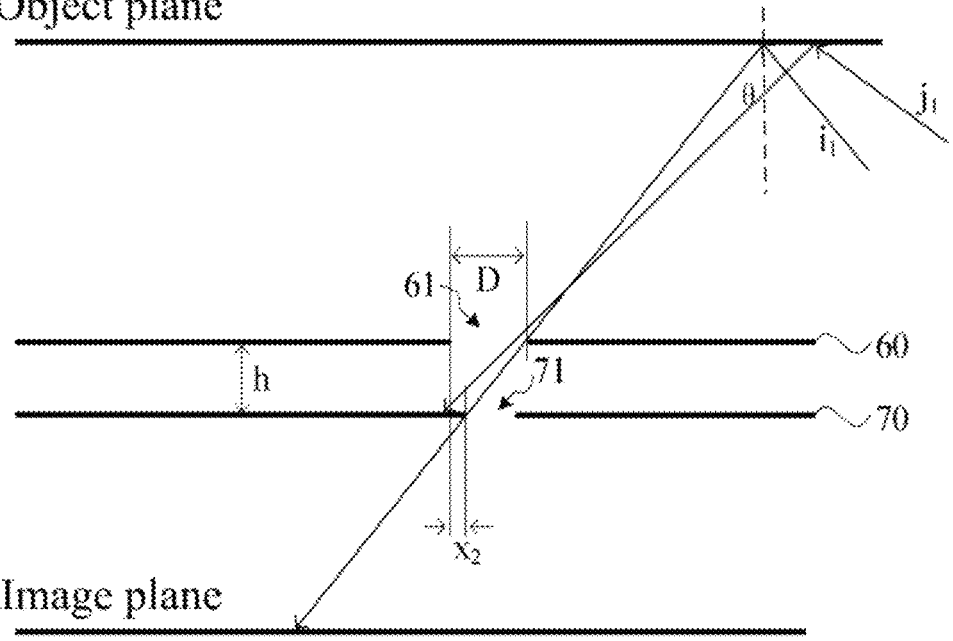
FIGS. 14 and 15 are partial cross-sectional views of another display panel taken along a direction perpendicular to a base substrate according to an embodiment of the present disclosure.
Figure 15:
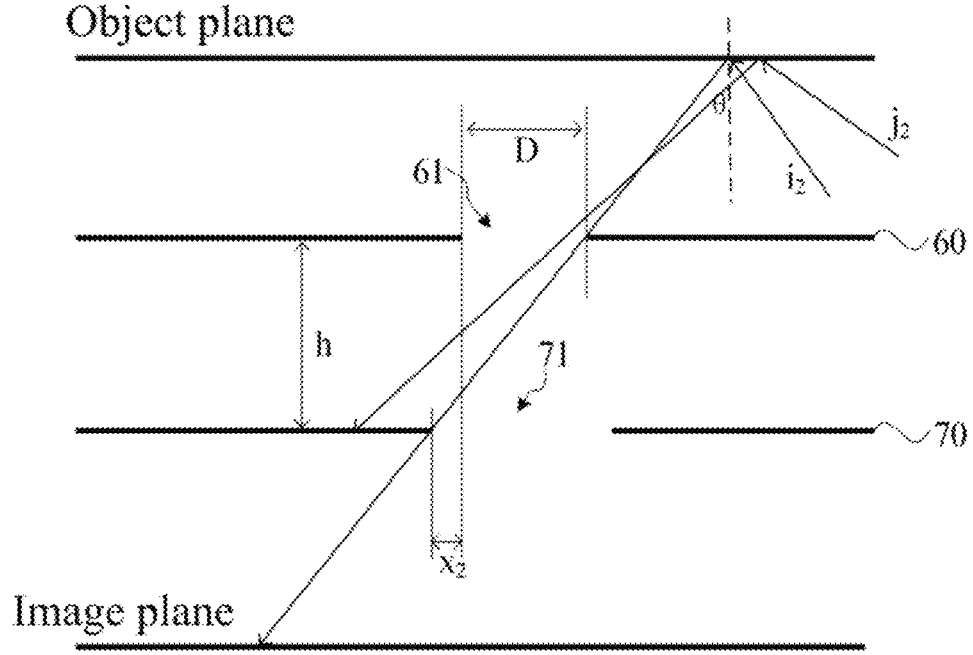

FIGS. 14 and 15 are partial cross-sectional views of a display panel according to another embodiment of the present disclosure. FIG. 14 shows a case where the distance between the first light-shielding layer 60 and the second light-shielding layer 70 is relatively small (h·tan θ<D), in this case, the width of the second imaging pin-hole 71 is smaller than the width of the first imaging pin-hole 61. An angle of incidence at which beam $i_1$ is incident onto the object plane (the touch surface of the protective layer) is $$\theta = \arcsin\left(\frac{1}{n_1}\right),$$

where $n_1$ denotes the refractive index of the protective layer, and the refractive index of air is 1. FIG. 14 shows a critical case in which the beam $i_1$, after being totally reflected by the object plane, passes exactly through the right edge of the first imaging pin-hole 61 and the left edge of the second imaging pin-hole 71, in this case, $x'_0$=D−h·tan θ, where h denotes the distance between the first light-shielding layer 60 and the second light-shielding layer 70 in the direction perpendicular to the base substrate, and D denotes the width of the first imaging pin-hole 61. For a beam having an angle of incidence greater than θ, such as beam $j_1$ in FIG. 14, the beam $j_1$, after being totally reflected by the object plane, is shielded by the second light-shielding layer 70. The distance between the projection of the edge of the first imaging pin-hole onto the plane where the second imaging pin-hole is located and the edge of the second imaging pin-hole is greater than or equal to $x'_0$, so that the second light-shielding layer 70 shields beams which are directly and totally reflected by the protective layer and do not carry any fingerprint information, thus reducing the intensity of the interference light, and improving the fingerprint recognition accuracy. In specific implementation, the first light-shielding layer 60 may adopt a whole surface for shielding light, a position of the first light-shielding layer 60 satisfies object distance and image distance conditions required for imaging, and the width of the first imaging pin-holes 61 satisfies the pin-hole imaging conditions; the second light-shielding layer 70 is provided only to shield beams totally reflected by the object plane, so the second light-shielding layer 70 may not adopt a whole surface for shielding, and in the specific implementation, a shape of the second light-shielding layer 70 may be designed as long as not shielding the field of view of the first imaging pin-holes 61.

Similarly, FIG. 15 shows a case where the distance between the first light-shielding layer 60 and the second light-shielding layer 70 is relatively large (h·tan θ>D), in this case, the width of the second imaging pin-hole 71 is greater than the width of the first imaging pin-hole 61. An angle of incidence at which beam $i_2$ is incident onto the object plane (the touch surface of the protective layer) is $$\theta = \arcsin\left(\frac{1}{n_1}\right),$$

where $n_1$ denotes the refractive index of the protective layer, and the refractive index of air is 1. FIG. 15 shows a critical case in which the beam $i_2$, after being totally reflected by the object plane, passes exactly through the right edge of the first imaging pin-hole 61 and the left edge of the second imaging pin-hole 71. In this case, $x''_0 = h \cdot \tan \theta - D$, where h denotes the distance between the first light-shielding layer 60 and the second light-shielding layer 70 in the direction perpendicular to the base substrate, and D denotes the width of the first imaging pin-hole 61. For a beam having an angle of incidence greater than θ, such as beam $j_2$ in FIG. 15, the beam $j_2$, after being totally reflected by the object plane, is shielded by the second light-shielding layer 70. The distance between the projection of the edge of the first imaging pin-hole onto the plane where the second imaging pin-hole is located and the edge of the second imaging pin-hole is less than or equal to $x''_0$, so that the second light-shielding layer 70 shields beams which are directly and totally reflected by the protective layer and do not carry any fingerprint information, thus reducing the intensity of the interference light, and improving the fingerprint recognition accuracy.

In some embodiments, the second light-shielding layer may be a black matrix. In other embodiments, the second light-shielding layer may be a metal layer in the display panel. Optionally, the display panel includes multiple metal layers, where at least a part of the metal layers include multiple metal lines, and the metal layer(s) is reused as the second light-shielding layer. The following are several implementations in which the metal layer is reused as the second light-shielding layer. It is to be understood that the following implementations are only illustrative and not to limit the embodiments of the present disclosure.

Optionally, at least one metal layer forms the touch layer, where the touch layer includes multiple mesh-shaped touch electrodes, the mesh-shaped touch electrodes include multiple intersecting metal wires, and the metal wires form the second imaging pin-holes of the second light-shielding layer.

Figure 16:
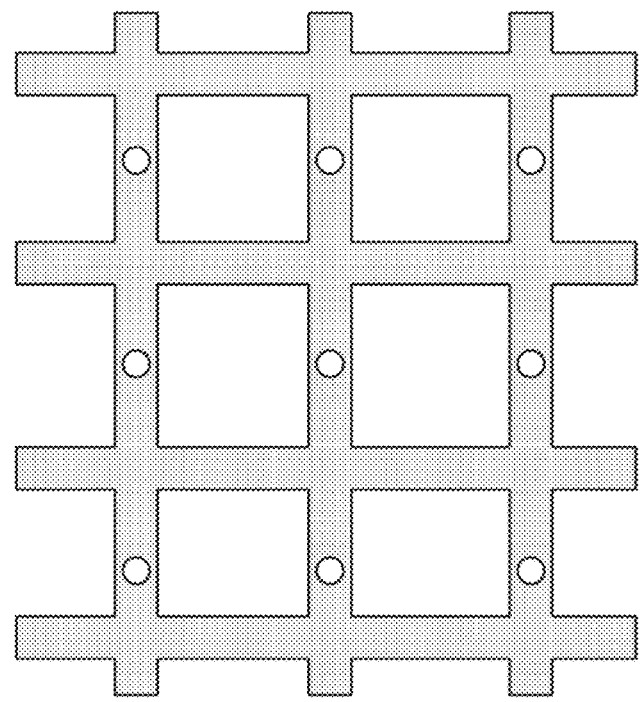
FIG. 16 is a structural diagram of a touch layer according to an embodiment of the present disclosure.

In some embodiments, metal wires can be made of silver or copper to form the touch electrodes having a metal mesh structure, which have the advantages of low resistance, high transmittance, high stability and bendability. The touch layer may be integrated inside the display panel, for example, the touch layer is provided on a thin film encapsulation layer of the OLED to form a TP on TFE structure. FIG. 16 is a structural diagram of a touch layer according to another exemplary embodiment of the present disclosure, where square openings in the figure correspond to the sub-pixels and circular openings serve as the second imaging pin-holes.

Since a driving circuit for driving the light-emitting elements to emit light is provided in the array layer, the metal lines in the driving circuit can shield light, so in some embodiments, the second light-shielding layer may not adopt a whole surface for shielding light, light-shielder merely needs to be formed around the second imaging pin-holes, so that the metal lines in the array layer can be reused as the second light-shielding layer. Optionally, the second light-shielding layer is located within the array layer, at least a part of the metal layers are located in the array layer, and at least one metal line located in the array layer forms at least a part of the edges of the second imaging pin-holes.

For example, in some embodiments, a single metal line with a relatively wide width in the array layer may be used as the second light-shielding layer, and optionally, a first metal line located in the array layer includes hollow structures, and the hollow structures form the second imaging pin-holes.

Figure 17:
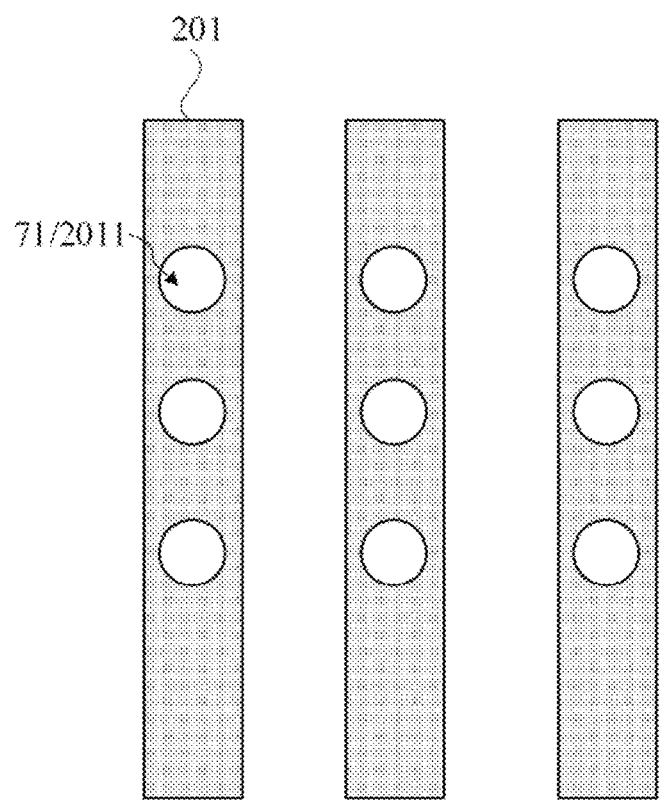
FIG. 17 is a structural diagram of a second light-shielding layer according to an embodiment of the present disclosure.

FIG. 17 is a structural diagram of a second light-shielding layer according to another exemplary embodiment of the present disclosure. FIG. 17 illustratively shows three first metal lines 201, where each first metal line is provided with the hollow structures 2011, and the hollow structures 2011 form the second imaging pin-holes 71. Specifically, in case of using a single metal line as the second light-shielding layer, a metal line with a relatively wide width should be selected to avoid line deformation or disconnection when forming the hollow structures. Optionally, the first metal lines 201 may include data signal lines and/or power voltage signal lines and a selection may be made in specific implementation according to actual requirements.

Optionally, projections of partial regions of at least a part of the first metal lines 201 onto the base substrate include "8" shapes or ring shapes.

Figure 18:
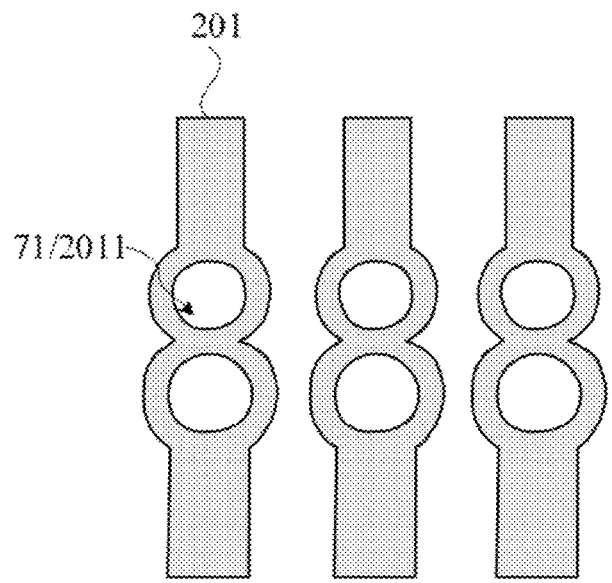
FIGS. 18 and 19 are structural diagrams of another second light-shielding layer according to an embodiment of the present disclosure.
Figure 19:
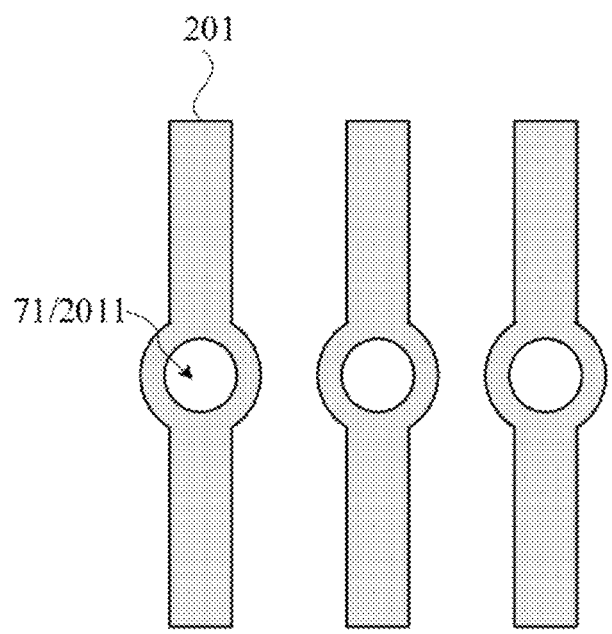

The edge of "8" shape or the edge of the ring shape forms a light-shielding portion at the edge of the second imaging pin-hole, and at least one hole in the "8" shape or the hole of the ring shape forms the second imaging pin-hole. FIGS. 18 and 19 are structural diagrams of a second light-shielding layer according to another exemplary embodiment of the present disclosure, where a partial region of the first metal line 201 is formed with an "8" shape in FIG. 18, and a partial region of the first metal line 201 is formed with a ring shape in FIG. 19. These designs can prevent the first metal lines 201 from disconnection. In other embodiments, "B" shapes or "D" shapes can also be formed, and the specific implementation can be designed according to the actual line situations.

In other embodiments, metal lines located in different layers may be used for separately forming partial edges of the second imaging pin-holes 71, thereby forming the second imaging pin-holes 71. Optionally, the second metal lines 202 and the third metal lines 203 located in the array layer jointly form the second imaging pin-holes 71, where the second metal lines 202 and the third metal lines 203 are locate in different metal layers.

Figure 20:
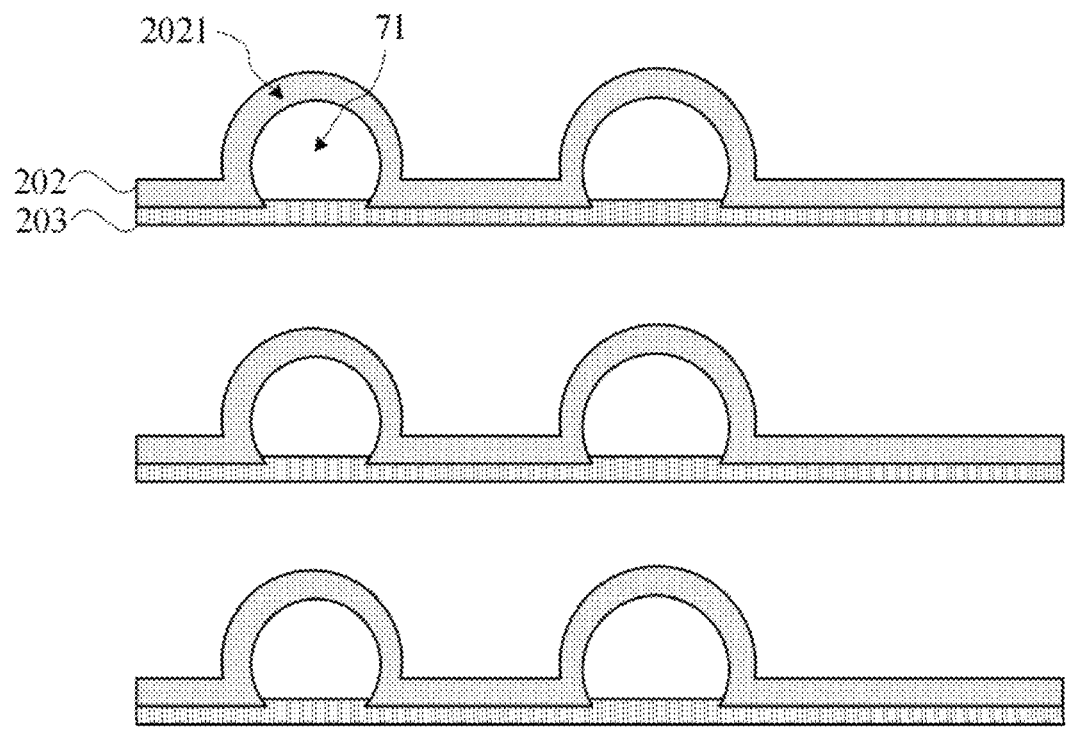
FIG. 20 is a structural diagram of another second light-shielding layer according to an embodiment of the present disclosure.

FIG. 20 is a structural diagram of a second light-shielding layer according to another exemplary embodiment of the present disclosure. Referring to FIG. 20, optionally, a projection of at least partial region of the second metal line 202 onto the base substrate is a first arc-shape 2021, and a first end of the first arc-shape 2021 and a second end of the first arc-shape 2021 respectively overlap one third metal line 203 to form one second imaging pin-hole 71. That is, the second imaging pin-hole 71 is formed by the second metal line 202 and the third metal line 203 together.

In some embodiments, the width of a single metal line may not be sufficient to form hollow portions to serve as the second imaging pin-holes 71, therefore, two metal lines are respectively used to form partial edges of the second imaging pin-holes 71; the second metal lines 202 and the third metal lines 203 are located in different metal layers, and two metal layers are partially overlapped in the direction perpendicular to the base substrate, thus forming the second imaging pin-holes 71. In specific implementation, the second metal lines 202 and the third metal lines 203, which are relatively close to each other and are located in relatively close film layers, may be selected. Optionally, the second metal lines 202 and the third metal lines 203 may be located in two adjacent metal layers in the array layer, so that the difference in light-shielding effect of the two metal layers caused due to a relatively far distance between the two metal layers can be avoided. Since the distance between a scanning signal line and a reference voltage signal line is relatively close in general pixel circuit arrangement, optionally, the second metal lines 202 include the scanning signal lines and the third metal lines 203 include the reference voltage signal lines; or the second metal lines 202 include the reference voltage signal lines and the third metal lines 203 include the scanning signal lines, thus avoiding major changes to the line layout of an existing pixel circuit.

Figure 21:
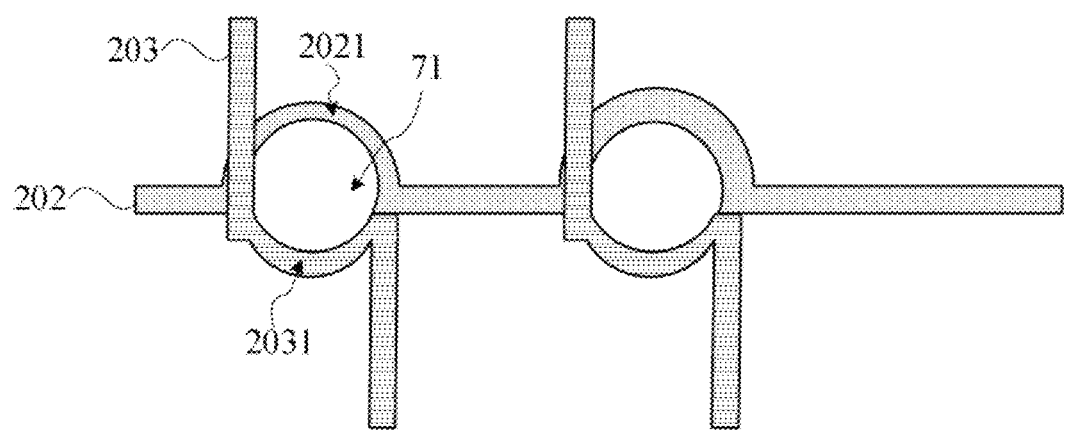
FIG. 21 is a structural diagram of another second light-shielding layer according to an embodiment of the present disclosure.

FIG. 21 is a structural diagram of another second light-shielding layer according to an embodiment of the present disclosure. Referring to FIG. 21, optionally, a projection of at least partial region of the second metal line 202 onto the base substrate is a first arc-shape 2021, and a projection of at least partial region of the third metal line 203 onto the base substrate is a second arc-shape 2031, where a first end of the first arc-shape 2021 and a first end of the second arc-shape 2031 are partially overlapped in the direction perpendicular to the base substrate, and a second end of the first arc-shape 2021 and a second end of the second arc-shape 2031 are partially overlapped in the direction perpendicular to the base substrate, so as to form the second imaging pin-hole 71. That is, the second imaging pin-hole 71 is formed by the second metal line 202 and the third metal line 203 together.

It is to be understood that FIG. 21 shows a top view of the second light-shielding layer, the direction perpendicular to the base substrate is a direction perpendicular to the paper surface.

The second imaging pin-holes 71 can be formed by two metal lines to achieve the fingerprint recognition based on the pin-hole imaging principle.

In the embodiment of FIG. 21, an extension direction of the second metal lines 202 intersects an extension direction of the third metal lines 203 (the extension direction refers to the overall extension direction of the lines). In another embodiment, optionally, the second metal lines 202 and the third metal lines 203 have the same extension direction. At least partial region of the second metal line 202 includes a wavy shape, and the second metal line 202 having the wavy shape includes multiple first arc-shape portions, where the multiple first arc-shape portions separately form partial edges of different second imaging pin-holes 71.

Figure 22:
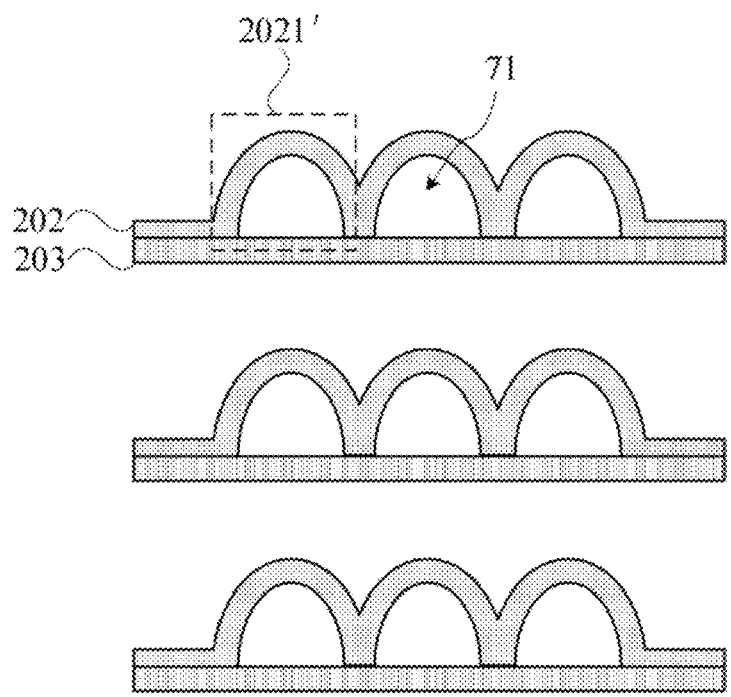
FIG. 22 is a structural diagram of another second light-shielding layer according to an embodiment of the present disclosure.
Figure 23:
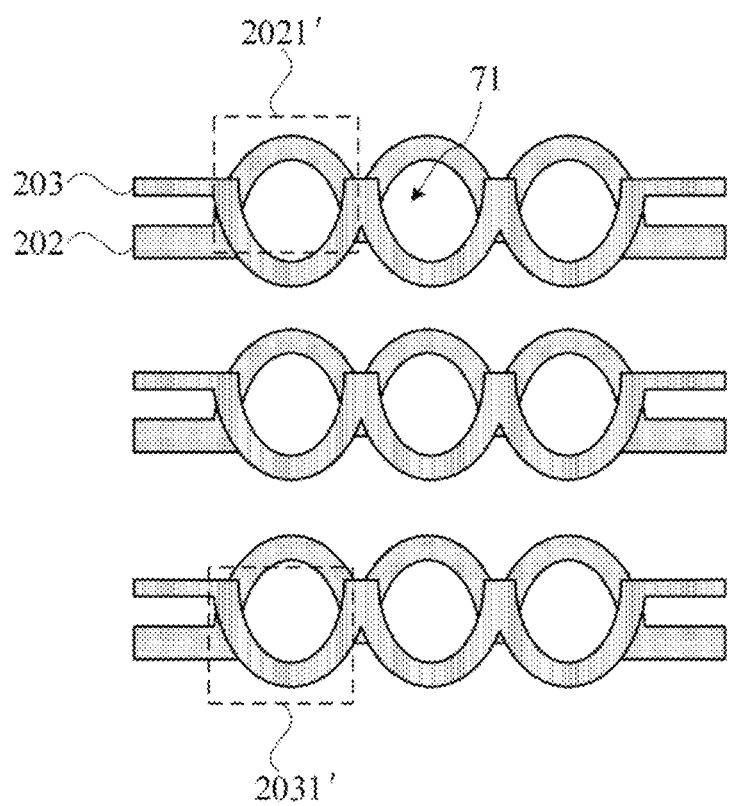
FIG. 23 is a structural diagram of another second light-shielding layer according to an embodiment of the present disclosure.

FIG. 22 is a structural diagram of a second light-shielding layer according to another exemplary embodiment of the present disclosure. Referring to FIG. 22, at least partial region of the second metal line 202 includes a wavy shape, and the second metal line 202 having the wavy shape includes multiple first arc-shape portions 2021', where the multiple first arc-shape portions 2021' separately form partial edges of different second imaging pin-holes 71. In other embodiment, it is also possible to provide that partial region of the second metal line 202 and partial region of the third metal line 203 each include the wavy shape. FIG. 23 is a structural diagram of a second light-shielding layer according to another exemplary embodiment of the present disclosure. Referring to FIG. 23, at least partial region of the second metal line 202 includes a wavy shape, and the second metal line 202 having the wavy shape includes multiple first arc-shape portions 2021', where the multiple first arc-shape portions 2021' separately form partial edges of different second imaging pin-holes 71; and at least partial region of the third metal line 203 includes a wavy shape, and the third metal line 203 having the wavy shape includes multiple second arc-shape portions 2031', where the multiple second arc-shape portions 2031' separately form partial edges of different second imaging pin-holes 71.

Figure 24:
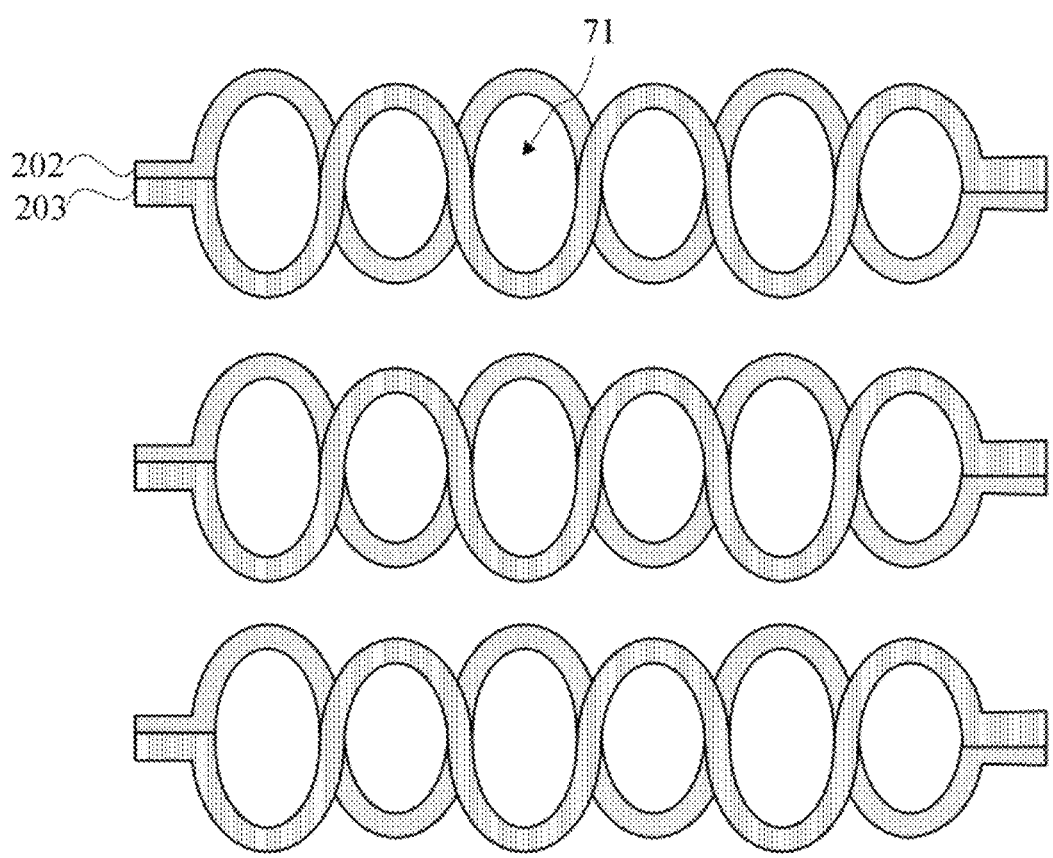
FIG. 24 is a structural diagram of another second light-shielding layer according to an embodiment of the present disclosure.

It is understood that since the second metal lines 202 and the third metal lines 203 are located in different metal layers, the light brightness at the side of metal lines which are closer to the touch surface of the display panel may differ from the brightness at the side of the other metal lines; hence, if edges at one side of the second imaging pin-holes are all formed by metal lines which are closer to the touch surface of the display panel, the light received by the light-sensing sensor may be uneven in brightness. FIG. 24 is a structural diagram of another second light-shielding layer according to an embodiment of the present disclosure. Different from FIG. 23, the second metal line 202 and the third metal line 203 alternately form edges on the same side of the second imaging pin-holes 71 to equalize the amount of light captured by the light-sensing sensor in each direction.

Optionally, the second metal line 202 having the wavy shape include at least first sub-arc lines and second sub-arc lines with different protruding directions, where the first sub-arc lines and the second sub-arc lines respectively form partial edges of different second imaging pin-holes 71.

Figure 25:
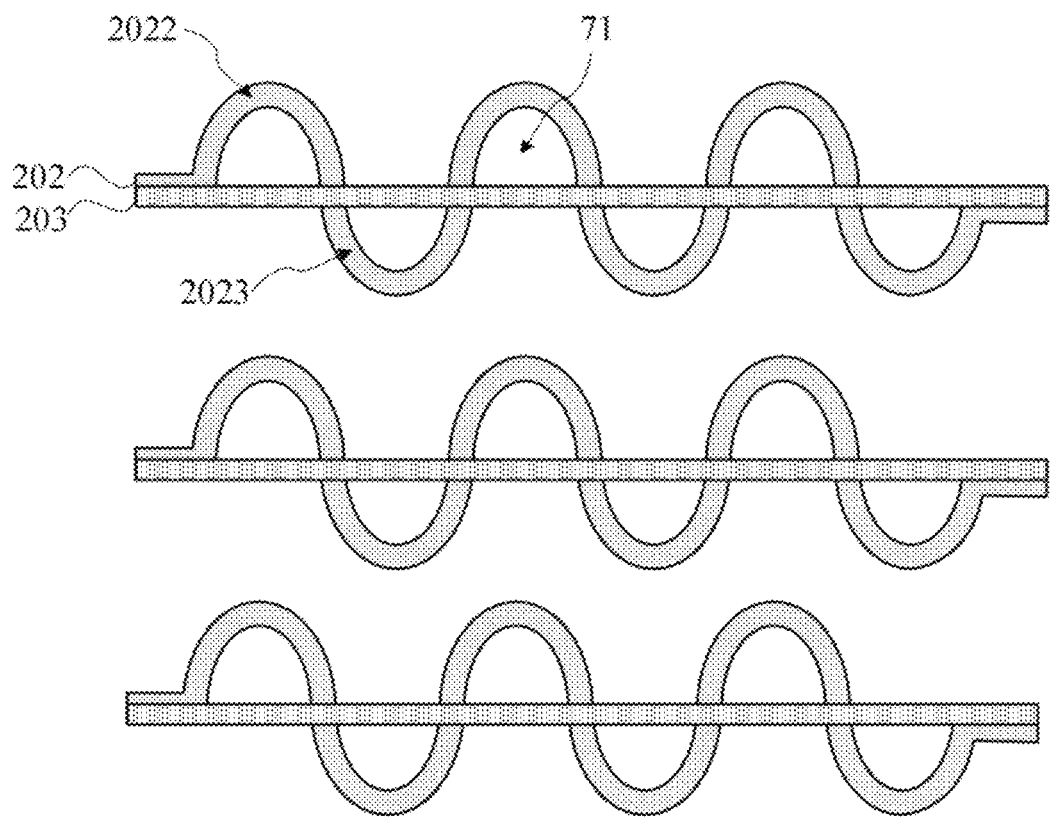
FIG. 25 is a structural diagram of another second light-shielding layer according to an embodiment of the present disclosure.

FIG. 25 is a structural diagram of a second light-shielding layer according to another exemplary embodiment of the present disclosure. The first sub-arc lines 2022 of the second metal line 202 and the second sub-arc lines 2023 of the second metal line 202 are located on two sides of the third metal line 203, respectively, to equalize the amount of light captured by the light-sensing sensor in each direction.

Figure 26:
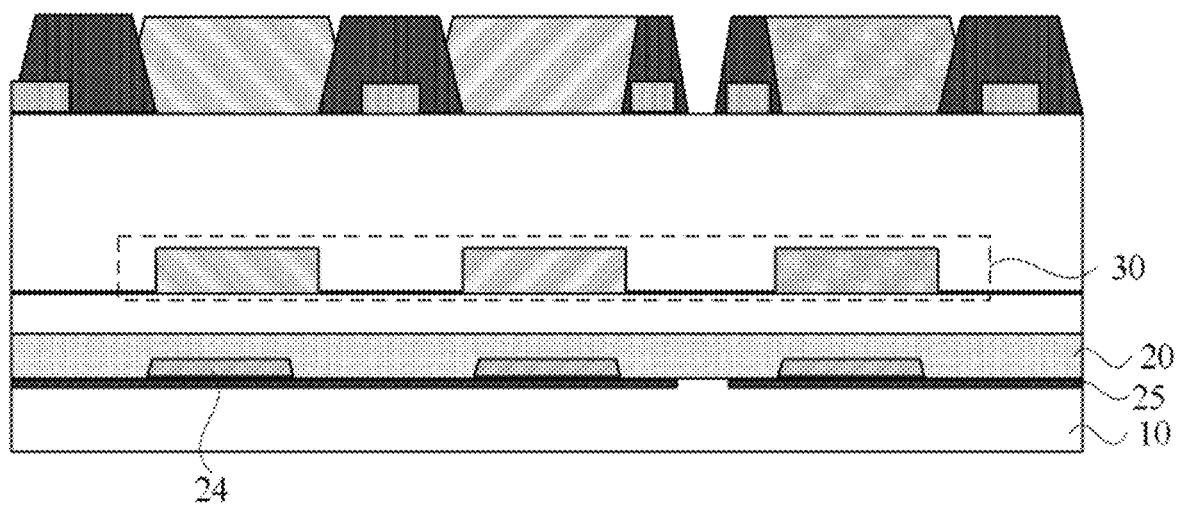
FIG. 26 is a structural diagram of another display panel according to an embodiment of the present disclosure.

FIG. 26 is a structural diagram of another display panel according to an embodiment of the present disclosure. Referring to FIG. 26, optionally, the array layer 20 includes a semiconductor layer 24 and a first metal layer 25 located at one side of the semiconductor layer 24 close to the base substrate 10. The first metal layer 25 covers the semiconductor layer 24 in a direction pointing from the base substrate 10 to the display layer 30. The first metal layer 25 is provided with multiple second imaging pin-holes.

It is understood that the semiconductor layer 24 is an active layer of a thin film transistor, and the first metal layer 25 has two functions, one is to shield the semiconductor layer 24 from possible influence on the semiconductor layer 24 due to light transmission from the side of the base substrate, and the other is to reuse as the second light-shielding layer to form the second imaging pin-holes for imaging.

Optionally, the light-sensing sensor layer is fully attached onto one side of the base substrate facing away from the array layer through an optical adhesive. The second light-shielding layer is located between the base substrate and the array layer, or the second light-shielding layer is located between the base substrate and the light-sensing sensor layer.

Figure 27:
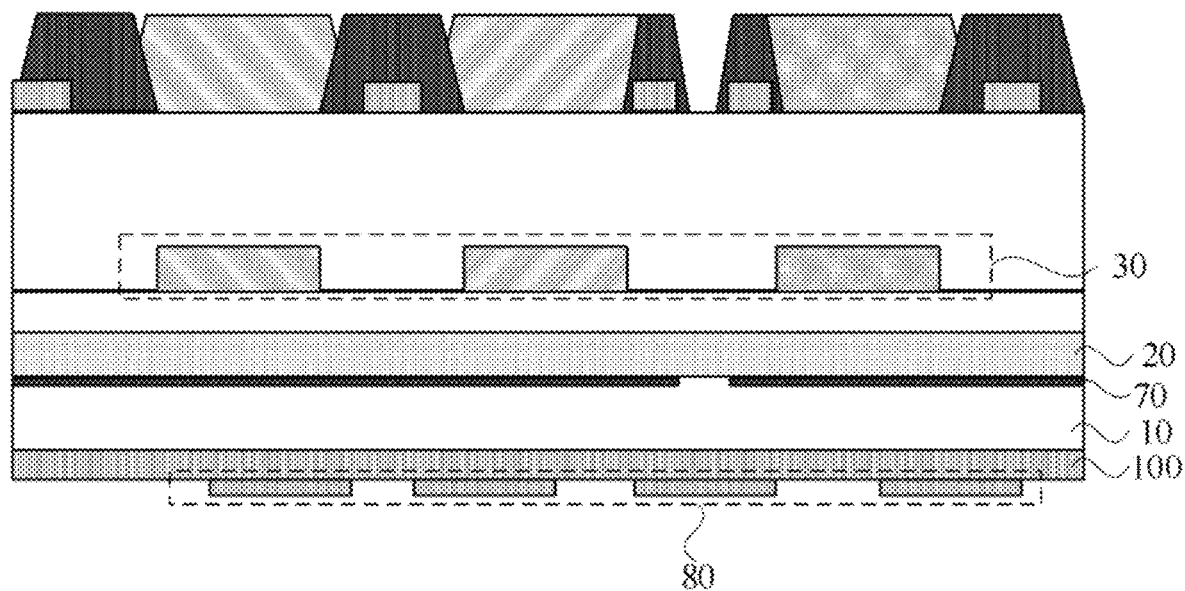
FIGS. 27 and 28 are structural diagrams of another display panel according to an embodiment of the present disclosure.
Figure 28:
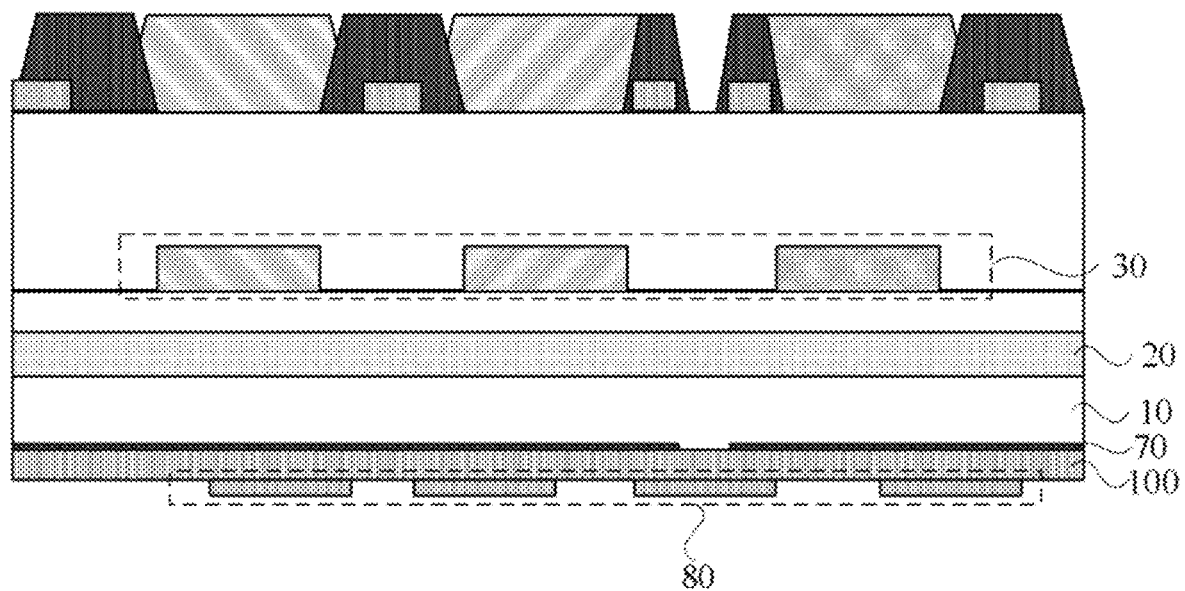

FIGS. 27 and 28 are structural diagrams of a display panel according to another exemplary embodiment of the present disclosure. Referring to FIGS. 27 and 28, the light-sensing sensor layer 80 is fully attached onto one side of the base substrate 10 facing away from the array layer 20 through the optical adhesive 100. The second light-shielding layer 70 is located between the base substrate 10 and the array layer 20 in FIG. 27, and the second light-shielding layer 70 is located between the base substrate 10 and the light-sensing sensor layer 80 in FIG. 28. In other embodiments, for example, the base substrate includes a multi-layer structure, and the second light-shielding layer may also be set in the base substrate, which are not limited in the embodiments of the present disclosure.

It is noted that in the above embodiments, the display panel including the color filter layer is merely illustrative. In other embodiments, it is also possible to provide a polarizer at one side of the light-emitting layer facing away from the base substrate without providing the color filter layer, and selection may be made according to actual situations in the practical implementation.

Figure 29:
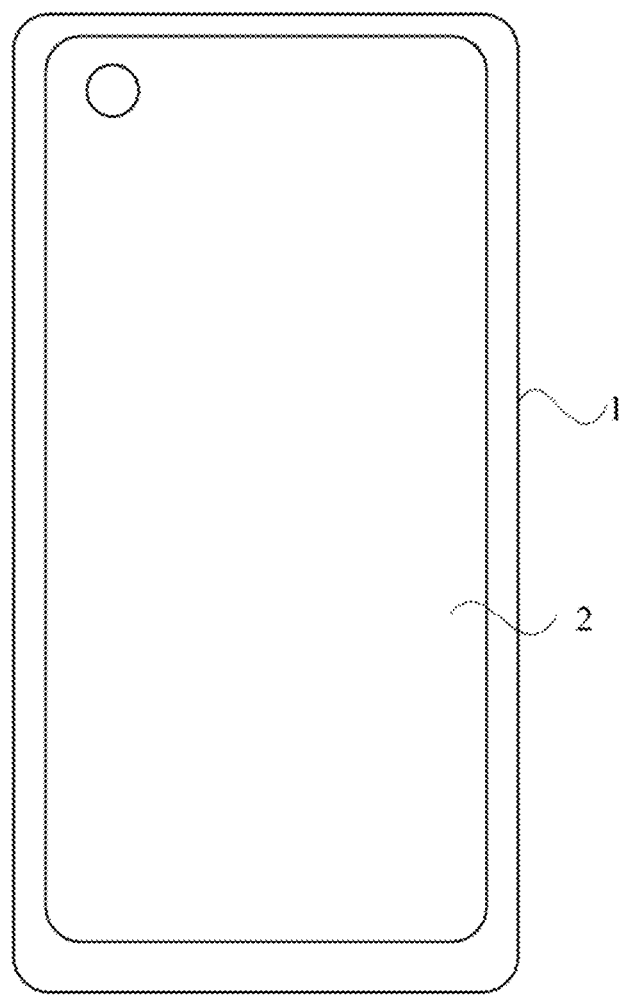
FIG. 29 is a structural diagram of a display device according to an embodiment of the present disclosure.

FIG. 29 is a structure diagram of a display device according to another exemplary embodiment of the present disclosure. Referring to FIG. 29, the display device 1 includes any one of the display panels 2 provided in the foregoing embodiments of the present disclosure. The display device 1 may be a mobile phone, a computer, an intelligent wearable device, etc.

It is noted that the preceding are only preferred embodiments of the present disclosure and the technical principles used therein. It will be appreciated by those skilled in the art that the present disclosure is not limited to the embodiments described herein. For those skilled in the art, various apparent modifications, adaptations, combinations and substitutions can be made without departing from the scope of the present disclosure. Therefore, while the present disclosure has been described in detail via the preceding embodiments, the present disclosure is not limited to the preceding embodiments and may include equivalent embodiments without departing from the concept of the present disclosure. The scope of the present disclosure is determined by the scope of the appended claims.

What is claimed is:
1. A display panel, comprising:
a base substrate;
an array layer located at one side of the base substrate;
a display layer located at one side of the array layer facing away from the base substrate, wherein the display layer comprises a plurality of light-emitting elements;
a protective layer located at one side of the display layer facing away from the array layer;
a first light-shielding layer, wherein the first light-shielding layer comprises a plurality of first imaging pin-holes;
a second light-shielding layer, wherein the second light-shielding layer comprises a plurality of second imaging pin-holes that correspond to the plurality of first imaging pin-holes; and
a light-sensing sensor layer, which is located at one side of the display layer facing away from the protective layer and is used for detecting images generated via the plurality of first imaging pin-hole;

wherein the second light-shielding layer shields a beam emitted from a pin-hole imaging light source and totally reflected by a touch surface of the protective layer;
the first light-shielding layer is located between the second light-shielding layer and the light-sensing sensor layer, and the second imaging pin-hole is larger than the first imaging pin-hole; and
a distance x1 between a projection of an edge of the first imaging pin-hole onto a plane where the second imaging pin-hole is located and an edge of the second imaging pin-hole satisfies:

$$x_1 \leq h \cdot \tan \theta - D;$$

wherein h denotes a distance between the first light-shielding layer and the second light-shielding layer in a direction perpendicular to the base substrate, $\theta$ denotes a critical angle at which a beam is totally reflected on the touch surface of the protective layer, and D denotes a width of the first imaging pin-hole.

2. The display panel of claim 1, further comprising a color filter layer located at one side of the display layer facing away from the array layer, wherein the color filter layer comprises a black matrix layer and color resists, the color resists are disposed at least corresponding to the plurality of light-emitting elements, and the black matrix layer is reused as the second light-shielding layer.

3. The display panel of claim 2, further comprising a touch layer located between the black matrix layer and the display layer, wherein the second light-shielding layer shields the touch layer in a direction perpendicular to a plane where the base substrate is located; and
a part of beams emitted by a light-emitting element serving as the pin-hole imaging light source is reflected by the touch layer adjacent to the second imaging pin-hole and then incident onto a region of the first light-shielding layer outside the first imaging pin-hole.

4. The display panel of claim 3, wherein the display layer comprises light-emitting elements with at least three light-emitting colors, light-emitting elements with one light-emitting color are served as pin-hole imaging light sources, and the plurality of second imaging pin-holes and the plurality of first imaging pin-holes are located between light-emitting elements having different light-emitting colors from the light-emitting elements served as the pin-hole imaging light sources.

5. The display panel of claim 4, wherein the light-emitting elements comprise red light-emitting elements, green light-emitting elements and blue light-emitting elements, and the green light-emitting elements are served as the pin-hole imaging light sources.

6. The display panel of claim 3, wherein at least part of the color resists is located between the touch layer and the display layer; and
wherein a color of a color resist material between at least part of the touch layer and the display layer is different from the light-emitting color of the light-emitting elements serving as the pin-hole imaging light sources.

7. The display panel of claim 1, wherein the light-sensing sensor layer is fully attached onto one side of the base substrate facing away from the array layer through an optical adhesive; and
wherein the second light-shielding layer is located between the base substrate and the array layer, or the second light-shielding layer is located between the base substrate and the light-sensing sensor layer.

8. A display device, comprising a display panel, wherein the display panel comprises:
- a base substrate;
- an array layer located at one side of the base substrate;
- a display layer located at one side of the array layer facing away from the base substrate, wherein the display layer comprises a plurality of light-emitting elements;
- a protective layer located at one side of the display layer facing away from the array layer;
- a first light-shielding layer, wherein the first light-shielding layer comprises a plurality of first imaging pin-holes;
- a second light-shielding layer, wherein the second light-shielding layer comprises a plurality of second imaging pin-holes that correspond to the plurality of first imaging pin-holes; and
- a light-sensing sensor layer, which is located at one side of the display layer facing away from the protective layer and is used for detecting images generated via the plurality of first imaging pin-hole;

wherein the second light-shielding layer shields a beam emitted from a pin-hole imaging light source and totally reflected by a touch surface of the protective layer;

the first light-shielding layer is located between the second light-shielding layer and the light-sensing sensor layer, and the second imaging pin-hole is larger than the first imaging pin-hole; and a distance x1 between a projection of an edge of the first imaging pin-hole onto a plane where the second imaging pin-hole is located and an edge of the second imaging pin-hole satisfies:

$x_1 \leq h \cdot \tan \theta - D;$ wherein h denotes a distance between the first light-shielding layer and the second light-shielding layer in a direction perpendicular to the base substrate, θ denotes a critical angle at which a beam is totally reflected on the touch surface of the protective layer, and D denotes a width of the first imaging pin-hole.